(12) United States Patent
Jin et al.

(10) Patent No.: US 10,950,640 B2
(45) Date of Patent: Mar. 16, 2021

(54) IMAGE SENSOR

(71) Applicant: SAMSUNG ELECTRONICS CO., LTD., Suwon-si (KR)

(72) Inventors: Young Gu Jin, Suwon-si (KR); Yong Hun Kwon, Hwaseong-si (KR); Young Chan Kim, Seongnam-si (KR); Sae Young Kim, Yongin-si (KR); Sung Young Seo, Bucheon-si (KR); Moo Sup Lim, Yongin-si (KR); Tae Sub Jung, Hwaseong-si (KR); Sung Ho Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/551,114

(22) Filed: Aug. 26, 2019

(65) Prior Publication Data

US 2020/0286938 A1    Sep. 10, 2020

(30) Foreign Application Priority Data

Mar. 6, 2019    (KR) .......................... 10-2019-0025715

(51) Int. Cl.
*H01L 27/146*    (2006.01)

(52) U.S. Cl.
CPC .. *H01L 27/14607* (2013.01); *H01L 27/14605* (2013.01); *H01L 27/14614* (2013.01); *H01L 27/14643* (2013.01); *H01L 27/1463* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 8,183,609 B2 | 5/2012 | Kudoh | |
| 8,710,561 B2 | 4/2014 | Ichikawa et al. | |
| 9,966,407 B2 | 5/2018 | kim et al. | |
| 2004/0021060 A1* | 2/2004 | Ohkawa | H01L 27/14689 250/214.1 |
| 2006/0132633 A1* | 6/2006 | Nam | H01L 27/14623 348/308 |
| 2008/0210990 A1* | 9/2008 | Lim | H01L 29/7835 257/292 |
| 2016/0049429 A1 | 2/2016 | Lee et al. | |
| 2018/0083055 A1 | 3/2018 | Kuwazawa et al. | |
| 2018/0331133 A1 | 11/2018 | Altice, Jr. et al. | |
| 2019/0281241 A1* | 9/2019 | Jin | G01S 7/4863 |
| 2020/0286938 A1* | 9/2020 | Jin | H01L 27/14609 |

* cited by examiner

*Primary Examiner* — Thien F Tran
(74) *Attorney, Agent, or Firm* — Sughrue Mion, PLLC

(57) ABSTRACT

An image sensor includes a plurality of pixels, at least one of the pixels comprising: a photodiode configured to generate charges in response to light; and a pixel circuit disposed on the substrate, and including a storage transistor configured to store the charges generated by the photodiode, and a transfer transistor connected between the storage transistor and a floating diffusion node, wherein a potential of a boundary region between the storage transistor and the transfer transistor has a first potential when the transfer transistor is in a turned-off state, and has a second potential, lower than the first potential, when the transfer transistor is in a turned-on state.

20 Claims, 25 Drawing Sheets

II-II'

IMAGE SENSOR

CROSS-REFERENCE TO THE RELATED APPLICATION

This application claims priority from Korean Patent Application No. 10-2019-0025715 filed on Mar. 6, 2019 in the Korean Intellectual Property Office, the disclosure of which is incorporated herein in its entirety by reference.

BACKGROUND

1. Field

Apparatuses and methods consistent with exemplary embodiments of the inventive concept relate to an image sensor.

2. Description Of Related Art

An image sensor is a semiconductor-based sensor onto which light is irradiated to produce an electrical signal, which may include a pixel array having a plurality of pixels, a logic circuit for driving the pixel array and generating an image, and the like. The pixels may include a photodiode generating charges in response to light, and a pixel circuit outputting a pixel signal using the charges generated by the photodiode. The charges generated by the photodiode may be stored in a storage element of the pixel circuit. In a case in which the charges stored in the storage element are not smoothly transferred to a subsequent node, the performance of the image sensor may deteriorate.

SUMMARY

Exemplary embodiments of the inventive concept may provide an image sensor having improved performance while significantly reducing an increase in an area of a storage element by increasing transfer efficiency of charges from a storage element of a pixel circuit to a floating diffusion node.

According to an aspect of the embodiments, an image sensor may include a plurality of pixels, at least one of the pixels including: a photodiode configured to generate charges in response to light; and a pixel circuit disposed on the substrate, and including a storage transistor configured to store the charges generated by the photodiode, and a transfer transistor connected between the storage transistor and a floating diffusion node, wherein a potential of a boundary region between the storage transistor and the transfer transistor has a first potential when the transfer transistor is in a turned-off state, and has a second potential, lower than the first potential, when the transfer transistor is in a turned-on state.

According to another aspect of the embodiments, an image sensor may include a plurality of pixels, at least one of the pixels including: a photodiode configured to generate charges in response to light; and a pixel circuit including a storage transistor connected to the photodiode and a transfer transistor connected between the storage transistor and a floating diffusion node, wherein, in the pixel circuit, a potential is gradually decreased between the transfer transistor and the storage transistor in a direction away from the storage transistor when the transfer transistor is turned on.

According to still another aspect of the embodiments, an image sensor may include a plurality of pixels, at least one of the pixels including: a photodiode configured to generate charges in response to light; and a pixel circuit including a plurality of transistors configured to output pixel signals using the charges, wherein an active region of at least one of the transistors includes a first impurity region and a second impurity region having an impurity concentration lower than an impurity concentration of the first impurity region, and wherein the second impurity region and the first impurity region are sequentially disposed according to a transfer direction of the charges.

BRIEF DESCRIPTION OF DRAWINGS

The above and other aspects, features and other advantages of the inventive concept will be more clearly understood from the following detailed description taken in conjunction with the accompanying drawings, in which.

DETAILED DESCRIPTION

Hereinafter, various embodiments of the inventive concept will be described in detail with reference to the accompanying drawings. These embodiments are all exemplary, and thus, the inventive concept is not limited thereto and may be realized in various other forms. An embodiment provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

It will be understood that when an element is referred to as being "over," "above," "on," "connected to" or "coupled to" another element, it can be directly over, above, on, connected or coupled to the other element or intervening elements may be present. In contrast, when an element is referred to as being "directly over," "directly above," "directly on," "directly connected to" or "directly coupled to" another element, there are no intervening elements present. Like numerals refer to like elements throughout.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of a device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1A:
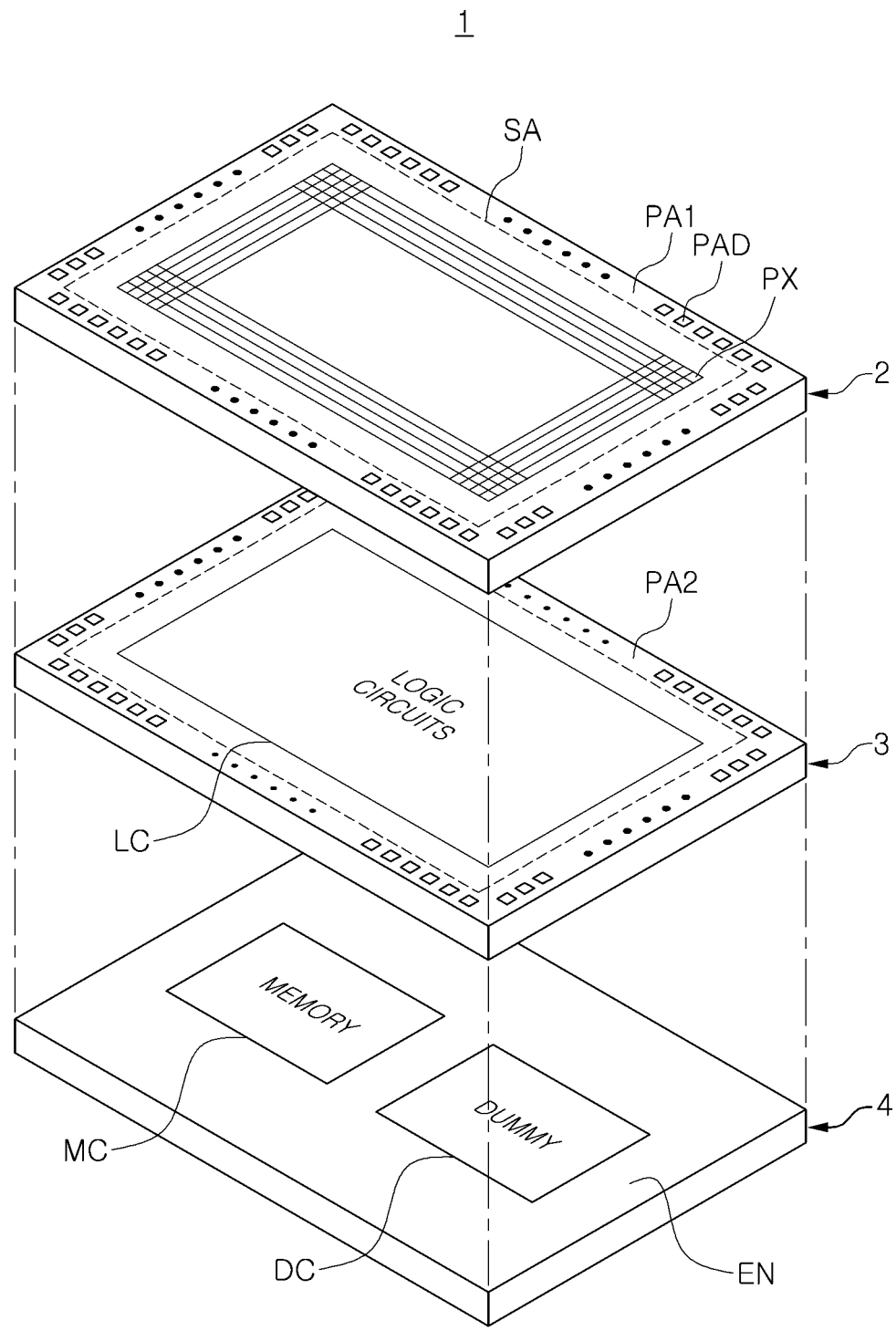
FIGS. 1A and 1B are diagrams illustrating an image sensor according to an embodiment.
Figure 1B:
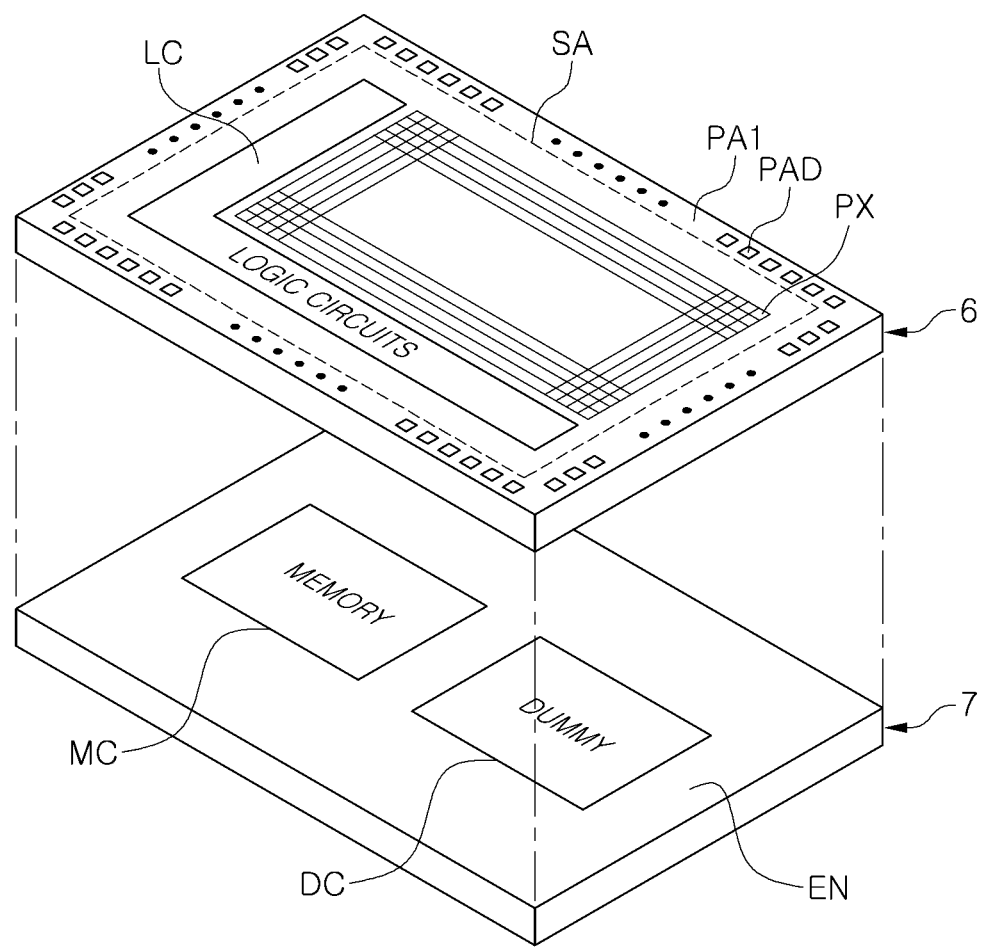

FIGS. 1A and 1B are diagrams illustrating an image sensor according to an exemplary embodiment.

Referring first to FIG. 1A, an image sensor 1 according to an exemplary embodiment may include a first layer 2, a second layer 3 provided below the first layer 2, and a third layer 4 provided below the second layer 3. The first layer 2, the second layer 3, and the third layer 4 may be stacked in directions perpendicular to each other. In an exemplary embodiment, the first layer 2 and the second layer 3 may be stacked on each other at a wafer level, and the third layer 4 may be attached to a lower portion of the second layer 3 at a chip level. The first to third layers 2 to 4 may be provided as a single semiconductor package.

The first layer 2 may include a sensing area SA on which a plurality of pixels PXs are provided and a first pad area PA1 provided around the sensing area SA. The first pad area PA1 may include a plurality of upper pads PADs which may be connected to lower pads provided on a second pad area PA2 and a control logic circuit LC of the second layer 3 through vias or the like.

Each of the pixels PXs may include a photodiode receiving light to generate charges, and a pixel circuit that processes the charges generated by the photodiode. The pixel circuit may include a plurality of transistors for outputting a voltage corresponding to the charges generated by the photodiode.

The second layer 3 may include a plurality of elements that provide the control logic circuit LC. The elements included in the control logic circuit LC may provide circuits for driving the pixels provided on the first layer 2, for example, a row driver, a column driver, and a timing controller. The elements included in the control logic circuit LC may be connected to the pixel circuit through the first and second pad areas PA1 and PA2. The control logic circuit LC may obtain a reset voltage and a pixel voltage from the pixels PXs to generate a pixel signal.

In an exemplary embodiment, at least one of the pixels PXs may include a plurality of photodiodes disposed on the same level. The pixel signals generated from the charges of each of the photodiodes may have a phase difference from each other, and the control logic circuit LC may provide an autofocusing function based on the phase difference between the pixel signals generated from the photodiodes included in a single pixel PX.

The third layer 4 provided below the second layer 3 may include a memory chip MC, a dummy chip DC, and an encapsulating layer EN encapsulating the memory chip MC and the dummy chip DC. The memory chip MC may be a dynamic random access memory (DRAM) or a static random access memory (SRAM), and the dummy chip may not have a function of actually storing data. The memory chip MC may be electrically connected to at least some of the elements included in the control logic circuit LC of the second layer 3 through bumps, and may store information necessary to provide the autofocusing function. In an exemplary embodiment, the bumps may be microbumps.

Next, referring to FIG. 1B, an image sensor 5 according to an exemplary embodiment may include a first layer 6 and a second layer 7. The first layer 6 may include a sensing area SA on which a plurality of pixels PXs are provided, a control logic circuit LC on which elements for driving the pixels PXs are provided, and a first pad area PA1 provided around the control logic circuit LC. The first pad area PA1 may include a plurality of upper pads PADs which may be connected to a memory chip MC provided on the second layer 7 through vias or the like. The second layer 7 may include a memory chip MC, a dummy chip DC, and an encapsulating layer EN encapsulating the memory chip MC and the dummy chip DC.

Figure 2:
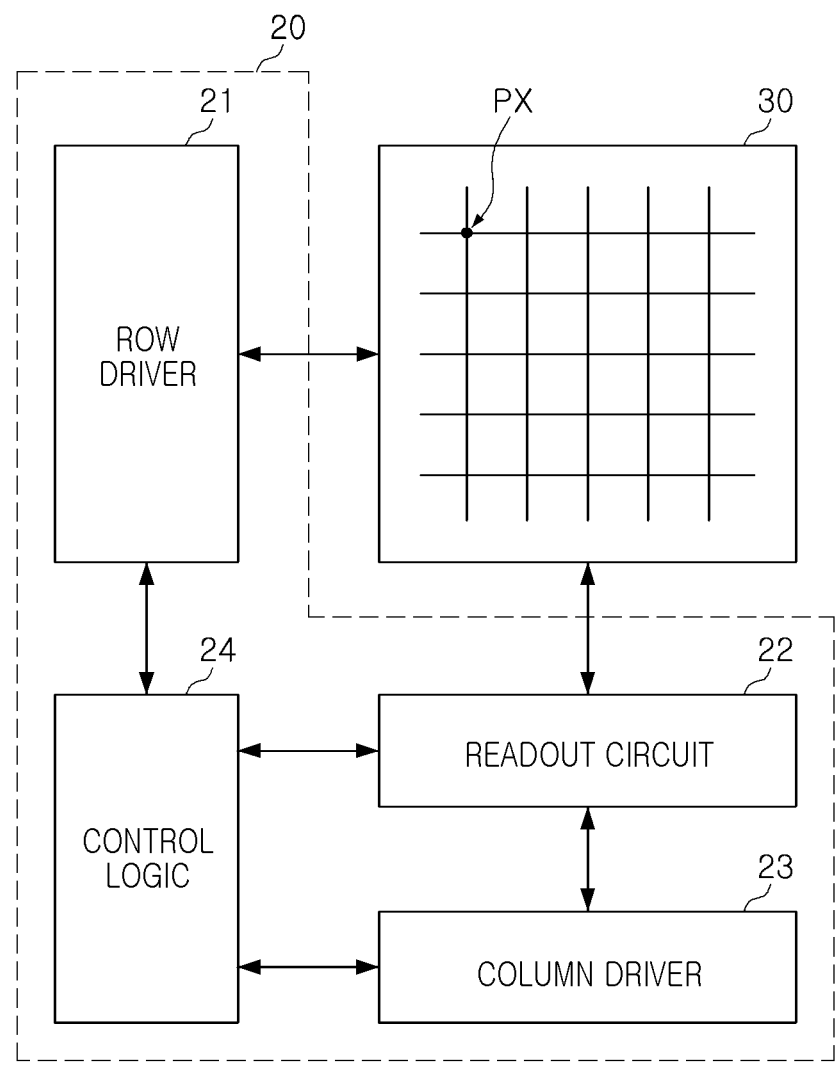
FIGS. 2 and 3 are block diagrams illustrating an image sensor according to an embodiment.
Figure 3:
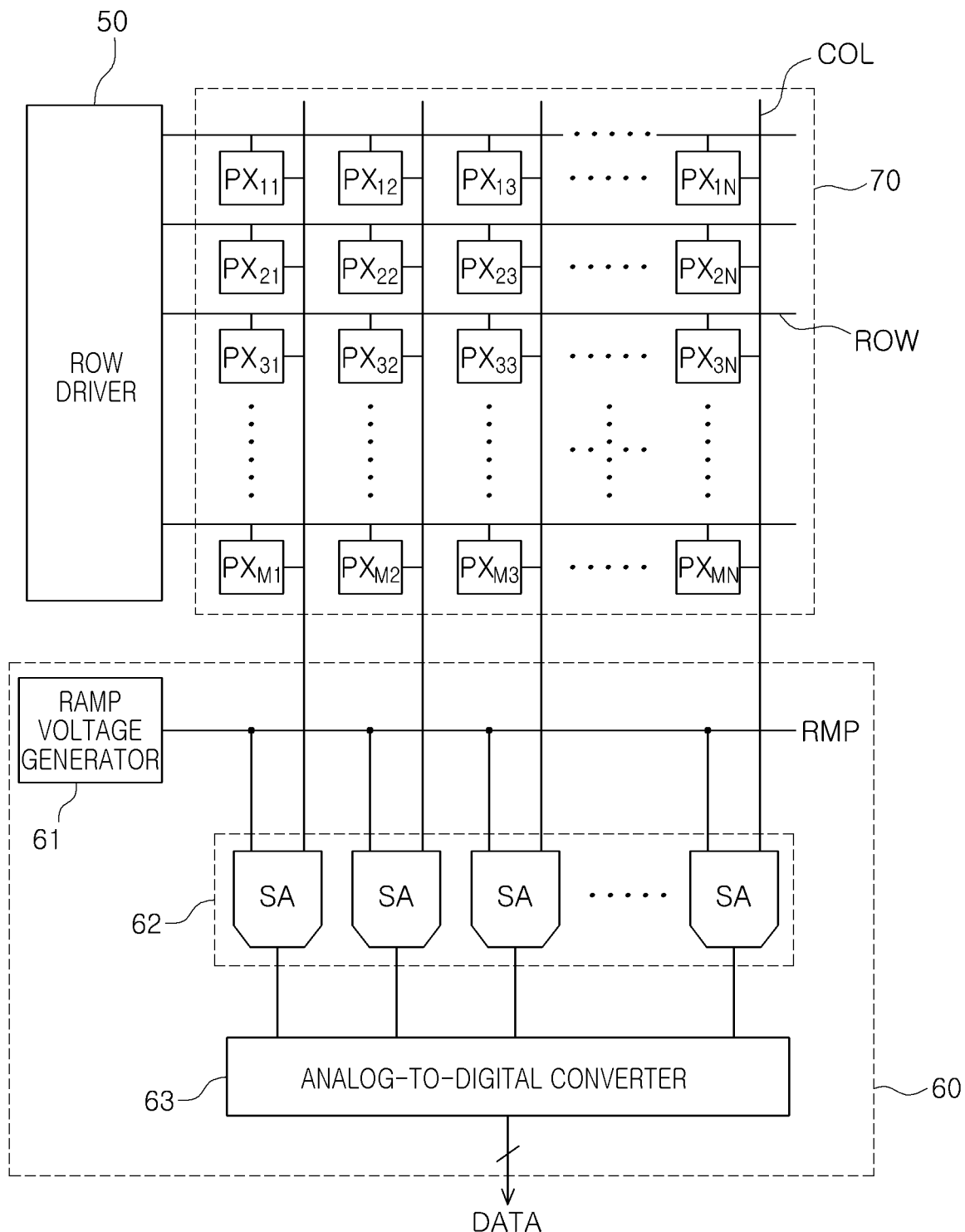

FIGS. 2 and 3 are block diagrams illustrating an image sensor according to an exemplary embodiment.

Referring first to FIG. 2, an image sensor 10 may include a controller 20, a pixel array 30, and the like.

The pixel array 30 may include a plurality of pixels PXs arranged in the form of an array along a plurality of rows and a plurality of columns. Each of the pixels PX may include a photodiode generating charges in response to optical signals incident from the outside, and a pixel circuit generating an electrical signal corresponding to the charges generated by the photodiode. As an example, the pixel circuit may include a floating diffuser, a storage transistor, a transfer transistor, a reset transistor, a driving transistor, a selection transistor, and the like. The configuration of the pixels PXs may vary depending on exemplary embodiments. As an example, each of the pixels PXs may include an organic photodiode that includes an organic material, unlike a silicon photodiode, or may be implemented as a digital pixel. When the pixel PX is implemented as the digital pixel, each of the pixels PXs may include a comparator, a counter converting an output of the comparator into a digital signal and outputting the digital signal, and the like.

The controller 20 may include a plurality of circuits for controlling the pixel array 30. As an example, the controller 20 may include a row driver 21, a readout circuit 22, a column driver 23, a control logic circuit 24, and the like. The row driver 21 may drive the pixel array 30 in units of rows. For example, the row driver 21 may generate a transfer control signal that controls the transfer transistor of the pixel circuit, a reset control signal that controls the reset transistor, a selection control signal that controls the selection transistor, and the like.

The readout circuit 22 may include a correlated doubled sampler (CDS), an analog-to-digital converter (ADC), and the like. The correlated double sampler may be connected to the pixels PXs included in a row selected by a row selection signal supplied by the row driver 21 through column lines, and may perform correlated double sampling to detect the reset voltage and the pixel voltage. The analog-to-digital converter may convert the reset voltage and the pixel voltage detected by the correlated double sampler into digital signals, and may transfer the digital signals to the column driver 23.

The column driver 23 may include a latch or buffer circuit in which the digital signals may be temporarily stored, an amplification circuit, and the like, and process the digital signals received from the readout circuit 22. The row driver 21, the readout circuit 22, and the column driver 23 may be controlled by the control logic circuit 24. The control logic circuit 24 may include a timing controller for controlling operation timings of the row driver 21, the readout circuit 22, and the column driver 23, an image signal processor for processing image data, and the like.

The control logic circuit 24 may perform signal processing for data output by the readout circuit 22 and the column driver 23 to generate image data. As an example, the image data may include a depth map. In addition, the control logic circuit 24 may generate the image data using the data output by the readout circuit 22 and the column driver 23.

Next, referring to FIG. 3, an image sensor 40 according to an exemplary embodiment may include a pixel array 70, and a controller for driving the pixel array 70. The controller may include a row driver 50, a readout circuit 60, and the like. The readout circuit 60 may include a ramp voltage generator 61, a sampling circuit 62, an analog-to-digital converter 63, and the like. Data output by the analog-to-digital converter 63 may be input to a column driver.

The pixel array 70 may include a plurality of pixels $PX_{11}$ to $PX_{MN}$ provided at intersections of a plurality of row lines ROWs and a plurality of column lines COLs. The row driver 50 may input signals necessary to control the pixels $PX_{11}$ to $PX_{MN}$ through the row lines ROWs. As an example, the signals input to the pixels $PX_{11}$ to $PX_{MN}$ through the row lines ROWs may include a reset control signal RG, a transfer control signal TG, a selection control signal SEL, and the like. The row driver 50 may sequentially select each of the row lines ROWs. The row driver 50 may select one of the row lines ROWs during a predetermined horizontal period.

The sampling circuit 62 may obtain the reset voltage and the pixel voltage from some pixels connected to the row lines scanned by the row driver 50, among the pixels $PX_{11}$ to $PX_{MN}$. The sampling circuit 62 may include a plurality of samplers SAs, and the samplers SAs may be correlated double samplers. Each of the samplers SAs may receive a ramp voltage generated by the ramp voltage generator 61 through a first input terminal, and may also receive the reset voltage and the pixel voltage from the pixels $PX_{11}$ to $PX_{MN}$ through a second input terminal.

The image sensor 40 may operate in a global shutter manner. In the image sensor 40 operating in the global shutter manner, photodiodes included in the pixels $PX_{11}$ to $PX_{MN}$ may be reset at once and exposed to light for a predetermined exposure time. Hereinafter, a description will be provided with reference to FIG. 4.

Figure 4:
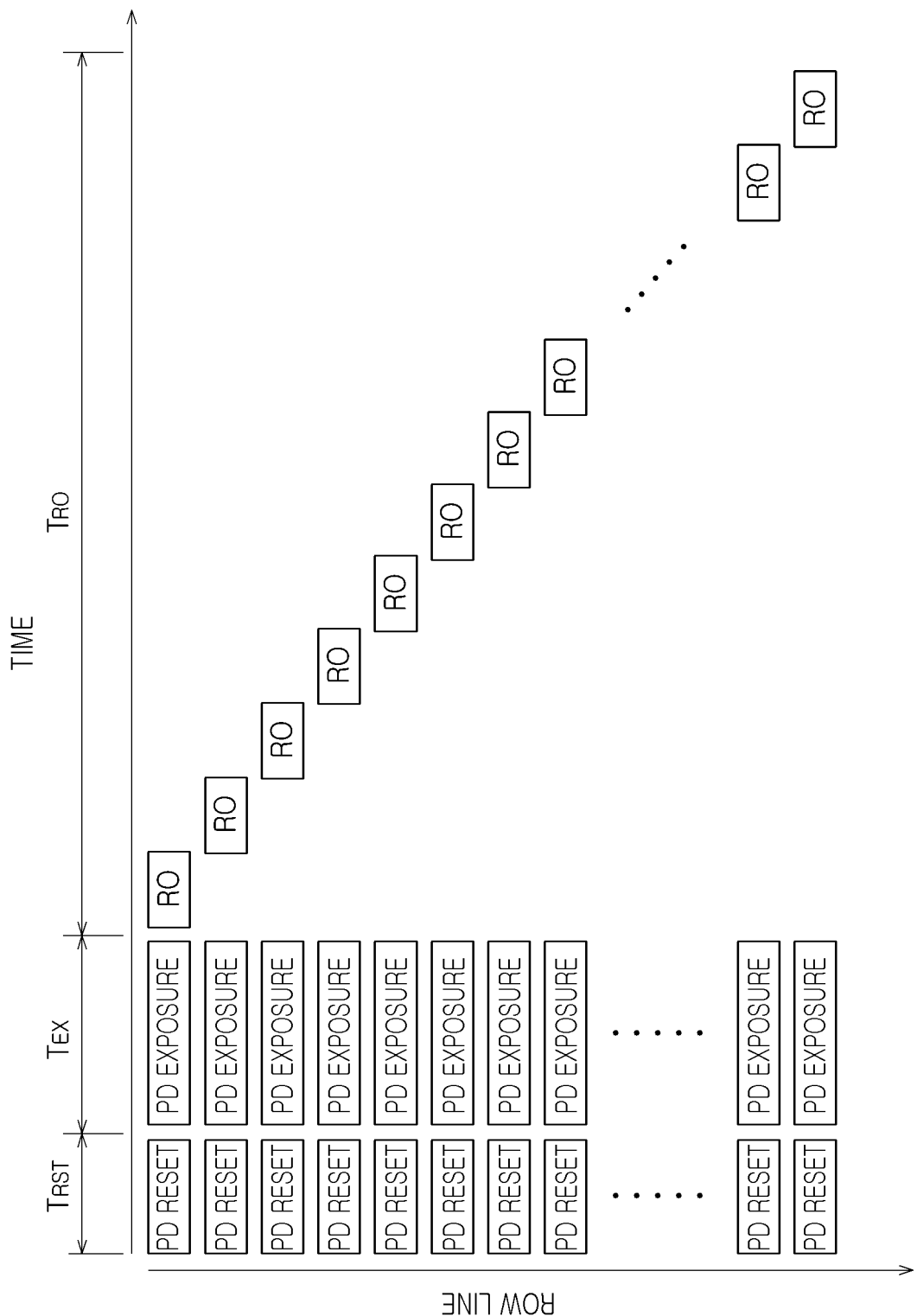
FIG. 4 is a diagram provided to describe an operation of an image sensor according to an embodiment.

FIG. 4 is a diagram provided to describe an operation of an image sensor according to an exemplary embodiment.

FIG. 4 is a diagram provided to describe a global shutter operation of the image sensor 40. Referring to FIG. 4, the photodiodes of the pixels $PX_{11}$ to $PX_{MN}$ included in the pixel array 70 may be simultaneously reset for a reset time $T_{RST}$. As an example, the row driver 50 may reset the photodiodes by turning on a reset transistor included in the pixel circuit of each pixel and connecting the photodiodes of the pixels $PX_{11}$ to $PX_{MN}$ to a predetermined power supply voltage.

Once the photodiodes are reset, the photodiodes included in the pixels $PX_{11}$ to $PX_{MN}$ may be exposed to light for an exposure time $T_{EX}$ to generate charges. As an example, the exposure time $T_{EX}$ may be determined by an operating environment, a shutter speed, an aperture value, and the like of the image sensor 40.

When the exposure time $T_{EX}$ has elapsed, the row driver 50 may scan each of the row lines ROWs. The readout circuit 60 may execute a readout operation for each of the pixels $PX_{11}$ to $PX_{MN}$ according to the order that the row driver 50 scans the row lines ROWs. The readout circuit 60 may read the reset voltage and the pixel voltage from each of the pixels $PX_{11}$ to $PX_{MN}$ for a readout time $T_{RO}$.

In order for the readout circuit 60 to read the reset voltage and the pixel voltage for the readout time $T_{RO}$, the charges generated by the photodiodes for the exposure time $T_{EX}$ may be stored in a storage area of the pixel circuit. The charges stored in the storage area may be moved to the floating diffusion node of the pixel circuit in response to the turn-on of the transfer transistor. The readout circuit 60 may read the reset voltage of the pixels $PX_{11}$ to $PX_{MN}$ before the transfer transistor is turned on, that is, while the charges are stored in the storage area. The readout circuit 60 may read the pixel voltage of the pixels $PX_{11}$ to $PX_{MN}$ after the transfer transistor is turned on by the row driver 50 and the charges in the storage area are moved to the floating diffusion node.

Figure 5:
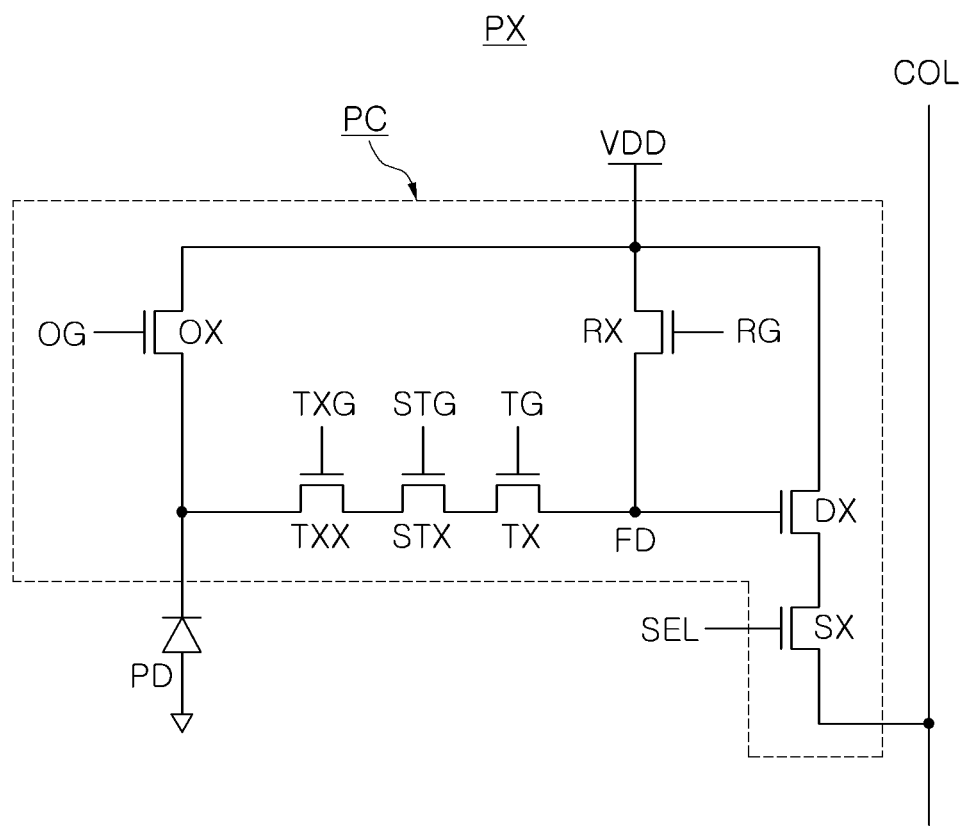
FIG. 5 is a circuit diagram illustrating a pixel circuit of a pixel included in an image sensor according to an embodiment.

FIG. 5 is a circuit diagram illustrating a pixel included in the image sensor according to an exemplary embodiment.

Referring to FIG. 5, a pixel PX according to an exemplary embodiment may include a pixel circuit PC and a photodiode PD. A signal generated by the pixel circuit PC using the charges generated by the photodiode PD may be output through a column line COL.

The pixel circuit PC may include a transfer transistor TX, a reset transistor RX, a driving transistor DX, a selection transistor SX, a storage transistor STX, an intermediate transfer transistor TXX, an overflow transistor OX, and the like. The overflow transistor OX may be turned on and turned off by an overflow control signal OG, and may be connected between a power supply node providing a power supply voltage VDD and the photodiode PD to prevent saturation of the photodiode PD.

In the image sensor operating in the global shutter manner, the photodiode PD, the charges stored in the storage transistor STX, the floating diffusion node FD, and the like may be reset for the reset time. The photodiode PD is exposed to light for the exposure time after the reset time, and the charges generated by the photodiode PD in response to light may be stored in the storage transistor STX.

As described above, in the image sensor operating in the global shutter manner, the readout operation may be executed in a rolling manner after the exposure time expires. As an example, in the readout operation, the reset voltage and the pixel voltage may be sequentially output. For example, the selection transistor SX is turned on such that the reset voltage may be output through the column line COL. After the reset voltage is output, the transfer transistor TX is turned on such that the charges stored in the storage transistor STX may be transferred to the floating diffusion node.

A voltage of the floating diffusion node FD may vary depending on an amount of charges transferred from the storage transistor STX. The driving transistor DX operating as a source-follower amplifier may output a pixel voltage corresponding to the amount of charges transferred to the floating diffusion node FD. Therefore, as transfer efficiency of the charges moving from the storage transistor STX to the floating diffusion node FD is higher when the transfer transistor TX is turned on, the performance of the image sensor may be improved.

In a general pixel circuit, due to an increase of a potential in a region adjacent to a boundary between the storage transistor STX and the transfer transistor TX when the transfer transistor TX is turned on, a potential hump (or potential barrier) phenomenon that hinders the transfer of charges may occur. In the exemplary embodiment, in a boundary region adjacent to the boundary between the storage transistor STX and the transfer transistor TX, at least one of the storage transistor STX and the transfer transistor TX may have a structure for preventing the potential hump. As an example, the structure may be formed on at least one of an active region of the storage transistor STX and a gate of the transfer transistor TX. Due to the above-mentioned structure, the potential of the boundary region may have a first potential when the transfer transistor TX is in a turned-off state, and may have a second potential, lower than the first potential, when the transfer transistor TX is the turned-on state. Therefore, the performance of the image sensor may be improved by increasing the transfer efficiency of the charges when the transfer transistor TX is in the turned-on state.

Figure 6:
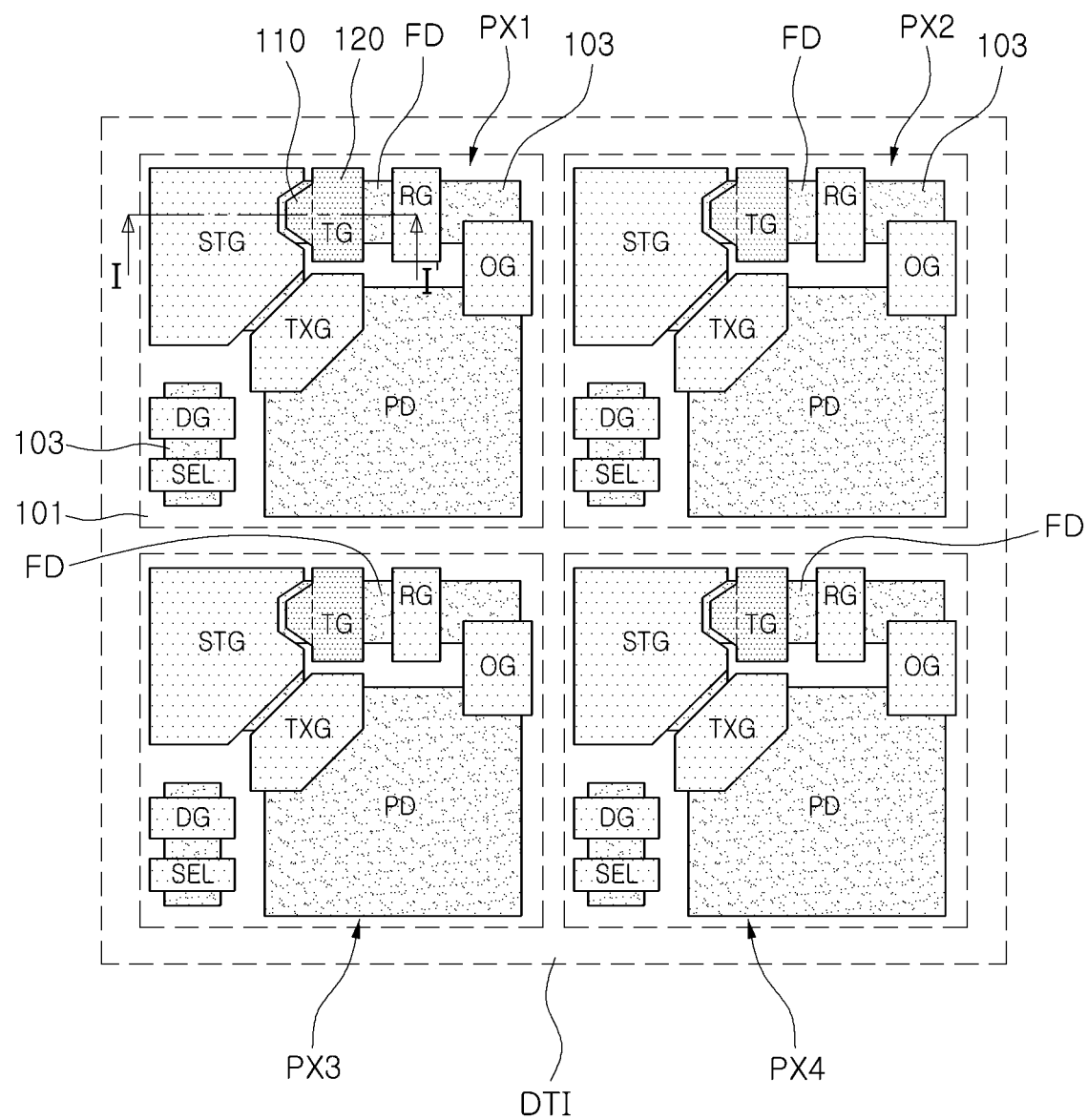
FIG. 6 is a plan view illustrating pixels included in an image sensor according to an embodiment.

FIG. 6 is a plan view illustrating pixels included in an image sensor according to an exemplary embodiment.

Referring to FIG. 6, an image sensor 100 according to an exemplary embodiment may include first to fourth pixels PX1 to PX4 arranged in the form of an array. FIG. 6 illustrates only some of a plurality of pixels included in the image sensor 100 and the number of the pixels included in the image sensor 100 may be variously modified according to a plate shape, resolution, and the like of the image sensor. The first to fourth pixels PX1 to PX4 may have a similar structure to one another, and may be optically separated from one another by a pixel separation film (DTI). For convenience of explanation, a pixel structure will hereinafter be described by exemplifying the first pixel PX1.

Referring to first pixel PX1, the first pixel PX may include an active region 103, a photodiode PD, and a plurality of gates which are formed by doping an impurity into a semiconductor substrate 101. The gates may be coupled to the active region 103 to provide a plurality of transistors included in the pixel circuit. As an example, the first pixel PX1 may include an intermediate transfer gate TXG, a storage gate STG, a transfer gate TG, a reset gate RG, an overflow gate OG, a driving gate DG, a selection gate SEL, and the like.

As an example, the image sensor 100 may operate in a global shutter manner. When the image sensor 100 starts to operate, the photodiodes PDs, and the charges stored in the storage transistors of the first to fourth pixels PX1 to PX4, and floating diffusion nodes FDs, may be reset for a reset time. The photodiodes PDs are simultaneously exposed to light for the exposure time after the reset time, and the charges generated by the photodiodes PDs may be stored in the storage transistors STXs.

For a readout time after the exposure time, readout operations for the first to fourth pixels PX1 to PX4 may be executed in a rolling manner. The reset voltage and the pixel voltage of the first pixel PX1 and the second pixel PX2 that do not share a column line may be simultaneously output, while the reset voltage and the pixel voltage of the first pixel PX1 and the third pixel PX3 that shares a column line may not be simultaneously output In the readout operation of the first to fourth pixels PX1 to PX4, the transfer transistor may be turned on by a voltage input to the transfer gate TG after the reset voltage is output, and the charges stored in the storage transistor may be transferred to the floating diffusion node FD.

As described above, when the transfer transistor is turned on and the charges are transferred, a problem that hinders the transfer of the charges may occur due to an increase in a potential around a boundary between the storage transistor and the transfer transistor. Referring to FIG. 6, in an exemplary embodiment, the transfer gate TG may include a first gate region 110 and a second gate region 120, and the first gate region 110 may protrude toward the storage transistor. The first gate region 110 may be disposed on at least a portion of the active region 103 of the storage transistor. In an exemplary embodiment, the storage gate STG may provide a space accommodating the first gate region 110.

By the first gate region 110, the potential at the boundary between the transfer transistor and the storage transistor may not increase when the transfer transistor is turned on. As an example, when the transistors included in the first to fourth pixels PX1 to PX4 are N-channel metal oxide semiconductor (NMOS) transistors, the transfer transistor may be turned on by applying a high voltage to the transfer gate TG. In this case, the potential is decreased at a boundary region adjacent to the boundary between the storage transistor and the transfer transistor by the high voltage applied to the first gate region 110 such that the charges may be smoothly transferred to the floating diffusion node FD.

In addition, by making the first gate region 110 narrower than the second gate region 120, the potential may be controlled to be tilted to only the floating diffusion node FD in the boundary region when the transfer transistor is turned on. Therefore, a reverse transfer of the charges from the floating diffusion node FD to the storage transistor may be prevented.

Figure 7A:
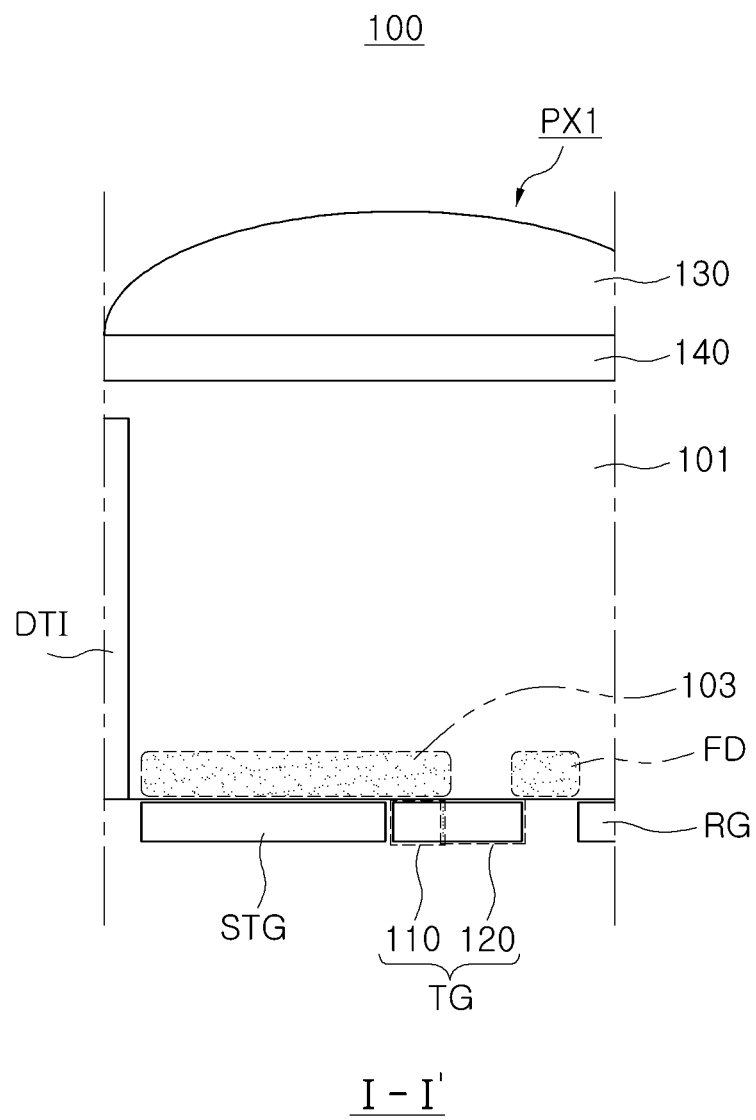
FIGS. 7A and 7B are cross-sectional views illustrating a cross section taken along a direction I-I' of the image sensor illustrated in FIG. 6.
Figure 7B:
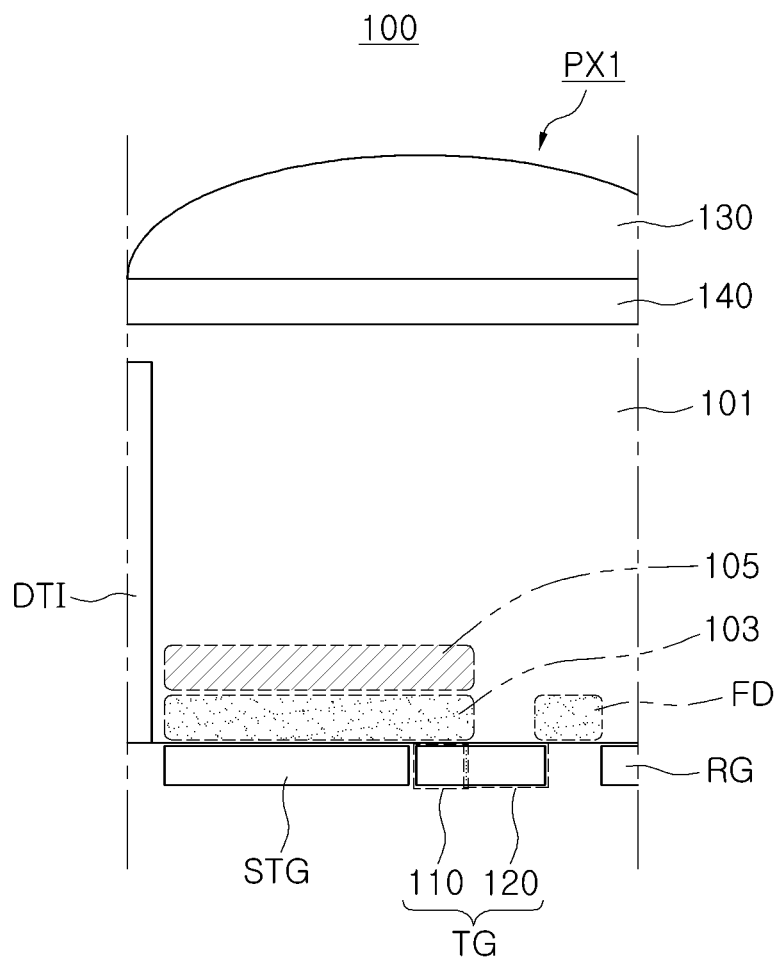

FIGS. 7A and 7B are cross-sectional views illustrating a cross section taken along a direction I-I' of the image sensor 100 illustrated in FIG. 6.

Referring first to FIG. 7A, the first pixel PX1 of the image sensor 100 may include a semiconductor substrate 101, a micro lens 130, an optical insulating layer 140, and a plurality of transistors. The optical insulating layer 140 may include a color filer, a planarization layer, and the like.

The pixel separation film DT1, the active region 103 for providing the transistors, and the like may be formed on the semiconductor substrate 101. At least a portion of the active region 103 may be provided as the floating diffusion node FD. Referring to FIG. 7A, the first gate region 110 of the transfer gate TG may be disposed on the active region 103 of the storage transistor, together with the storage gate STG. That is, the first gate region 110 of the transfer gate TG may overlap at least a portion of the active region of the storage transistor.

Next, referring to FIG. 7B, the first pixel PX1 may further include a barrier layer 105 provided below the active region 103 of the storage transistor. The barrier layer 105 may be doped with an impurity having conductivity different from that of a main charge carrier of the image sensor 100. As an example, when the photodiodes of the image sensor 100 use electrons generated in response to light as the main charge carrier and the transistors are the NMOS transistors, the barrier layer 105 may be doped with a p-type impurity. The barrier layer 105 may prevent the charges stored in the storage transistor from leaking.

Figure 8:
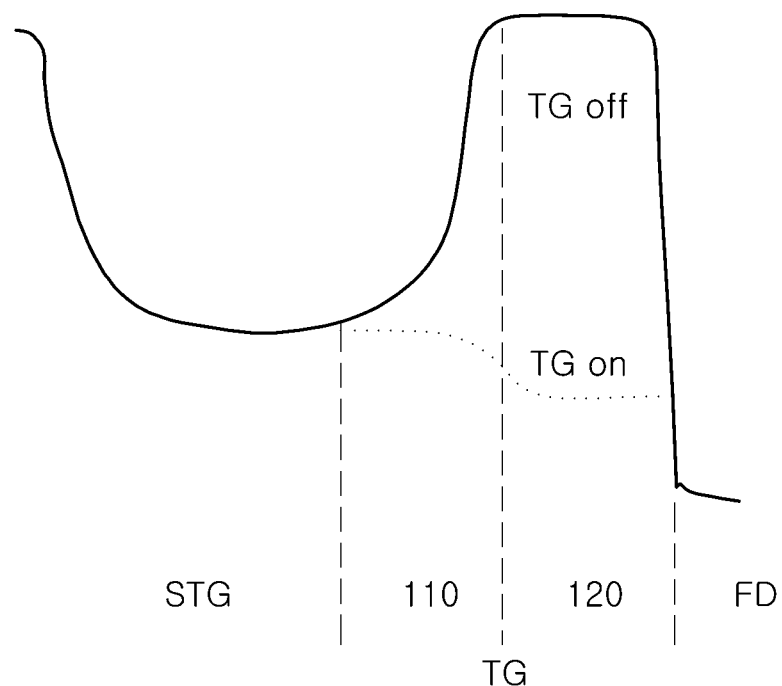
FIGS. 8 and 9 are diagrams provided to describe an operation of an image sensor according to an embodiment.
Figure 9:
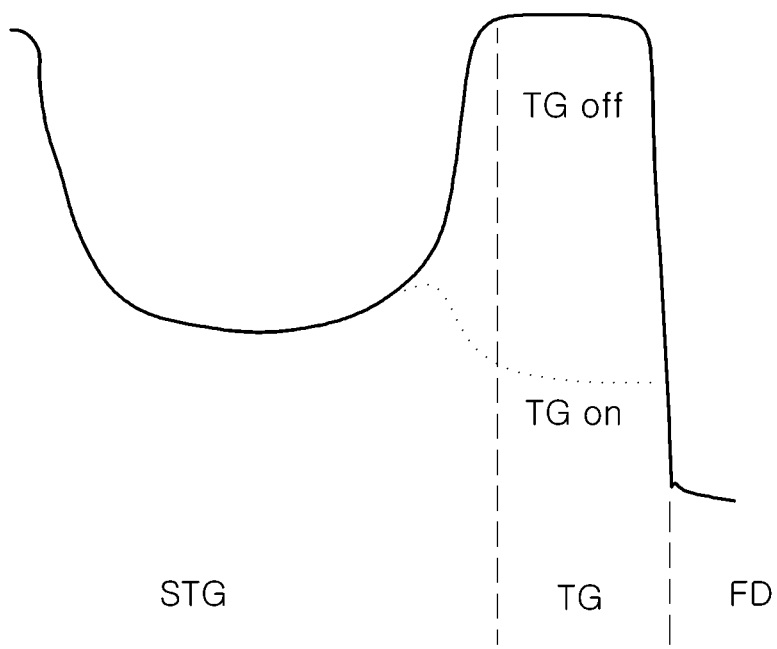

FIGS. 8 and 9 are diagrams provided to describe an operation of an image sensor according to an exemplary embodiment.

Referring to FIGS. 8 and 9, there is illustrated a change in potential of the storage transistor, the transfer transistor, and floating diffusion node FD according to an on/off operation of the transfer transistor. Referring first to FIG. 8, as the charges are stored in the storage transistor, the potential at a lower portion of the storage gate STG may be relatively low. The transfer gate TG may have the first gate region 110 and the second gate region 120 as described with reference to FIGS. 6, 7A, and 7B, and when a turn-off voltage is input to the transfer gate TG, the potential at a lower portion of the transfer gate TG maintains a high state such that the charges may not be transferred to the floating diffusion node FD.

When the turn-on voltage is input to the transfer gate TG to turn on the transfer transistor, the potential at the lower portion of the transfer gate TG is decreased such that the charges stored in the storage transistor may be transferred to the floating diffusion node FD. The potential at a lower portion of the first gate region 110 may be decreased by the turn-on voltage input to the first gate region 110 overlapping at least a portion of the active region of the storage transistor. Therefore, as illustrated in FIG. 8, the potential may be gradually decreased at the lower portion of the first gate region 110 corresponding to the boundary region adjacent to the boundary between the storage transistor and the transfer transistor. The potential may be decreased in a direction away from the storage transistor and being closer to the floating diffusion node FD.

In an exemplary embodiment, the potential of the boundary region corresponding to the lower portion of the first gate region 110 may have a first potential when the turn-off voltage is input to the transfer gate TG, and may have a second potential, lower than the first potential, when the turn-on voltage is input to the transfer gate TG. When the turn-on voltage is input to the transfer gate TG, the charges stored in the storage transistor may be smoothly transferred to the floating diffusion FD. Therefore, the performance of the image sensor may be improved without increasing an area of the storage transistor.

FIG. 9 is a diagram illustrating a change in potential when the first gate region 110 is not formed, that is, when the transfer gate TG includes only the second gate region 120. Referring to FIG. 9, as the first gate region 110 is omitted, a potential hump section in which the potential increases in the boundary region adjacent to the boundary between the storage transistor and the transfer transistor may appear. Therefore, even though the transfer transistor TG is turned on, the charges stored in the storage transistor may not be transferred to the floating diffusion node FD.

As described with reference to FIG. 8, in an exemplary embodiment, the potential hump section may be removed by forming the first gate region 110 in the transfer gate TG protruding toward the storage transistor. By the turn-on voltage input to the first gate region 110, the potential of a portion of the active region of the storage transistor adjacent to the transfer transistor may be decreased, and the potential hump section may be thus removed.

Figure 10:
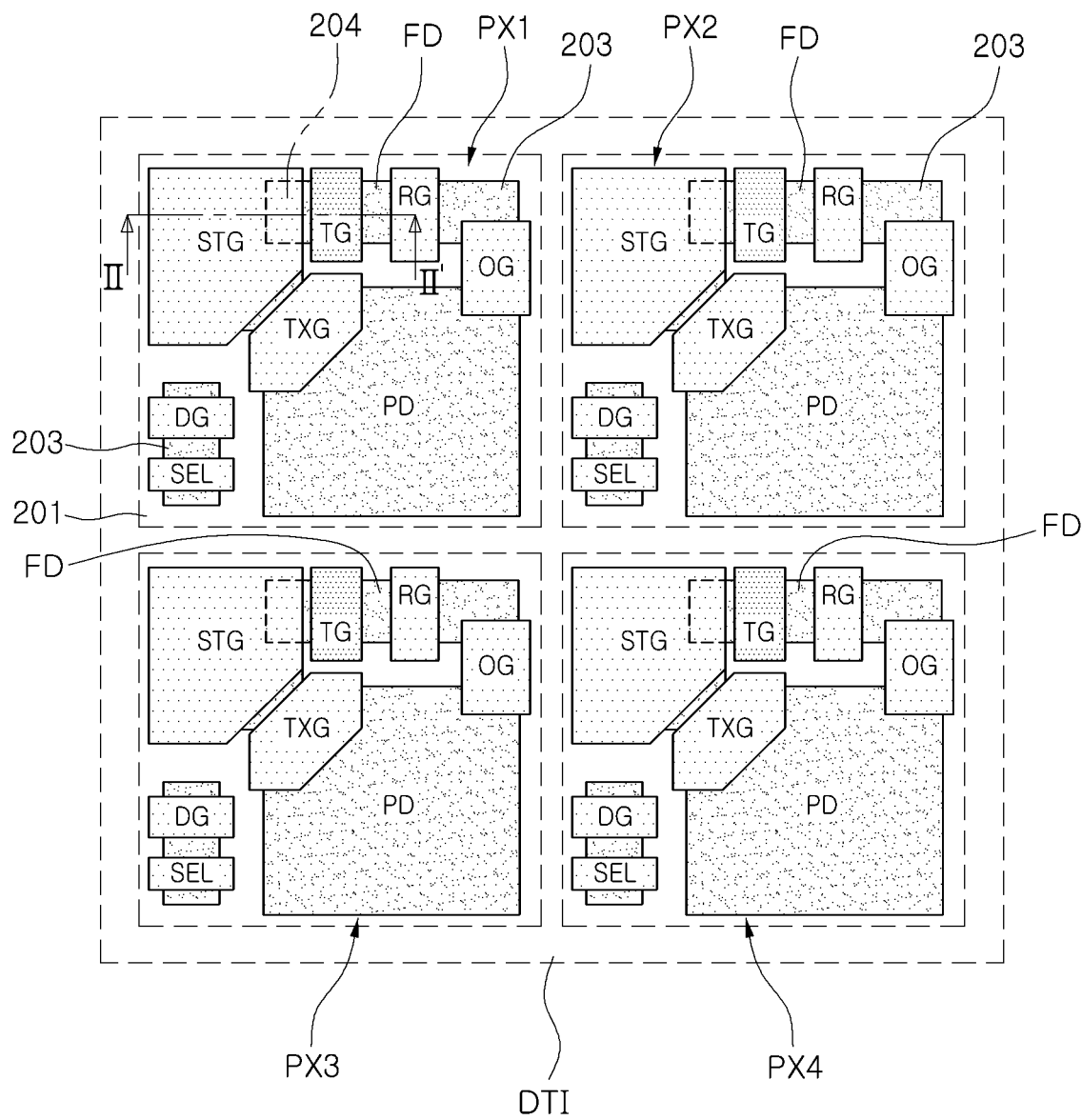
FIG. 10 is a plan view illustrating pixels included in an image sensor according to an embodiment.

FIG. 10 is a plan view illustrating pixels included in an image sensor according to an exemplary embodiment.

Referring to FIG. 10, an image sensor 200 according to an exemplary embodiment may include first to fourth pixels PX1 to PX4 arranged in the form of an array. Similar to FIG. 6, FIG. 10 illustrates only some of a plurality of pixels included in the image sensor 200 and the number of the pixels included in the image sensor 200 may be variously modified according to a plate shape, resolution, and the like of the image sensor. In describing the first to fourth pixels PX1 to PX4, the contents similar to those of the image sensor 100 of FIG. 6 will be omitted.

The charges generated by the photodiode of each of the first to fourth pixels PX1 to PX4 of the image sensor 200 may be stored in the storage transistor, and may be transferred to the floating diffusion node FD in response to the turn-on operation of the transfer transistor. In order that the potential hump section generated between the storage transistor and the transfer transistor do not hinder the transfer of the charges, the active region of the storage transistor may include a first impurity region 204 having a relatively higher impurity concentration. As illustrated in FIG. 10, the first impurity region 204 may be adjacent to the transfer transistor.

Figure 11A:
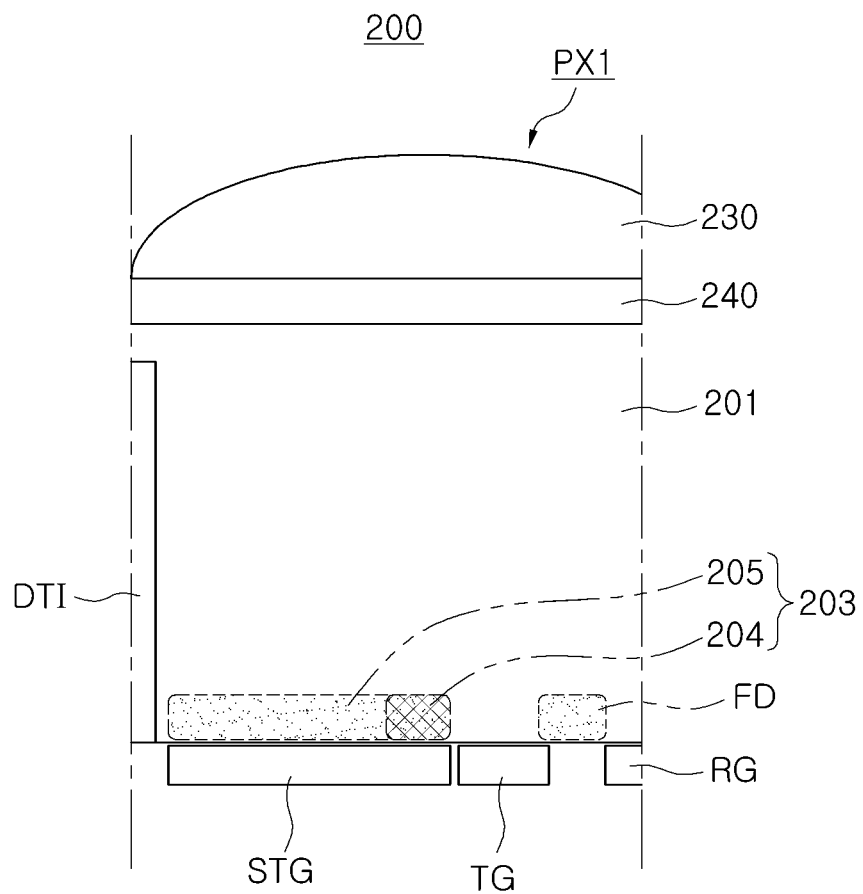
FIGS. 11A and 11B are cross-sectional views illustrating a cross section taken along a direction II-II' of the image sensor illustrated in FIG. 10.
Figure 11B:
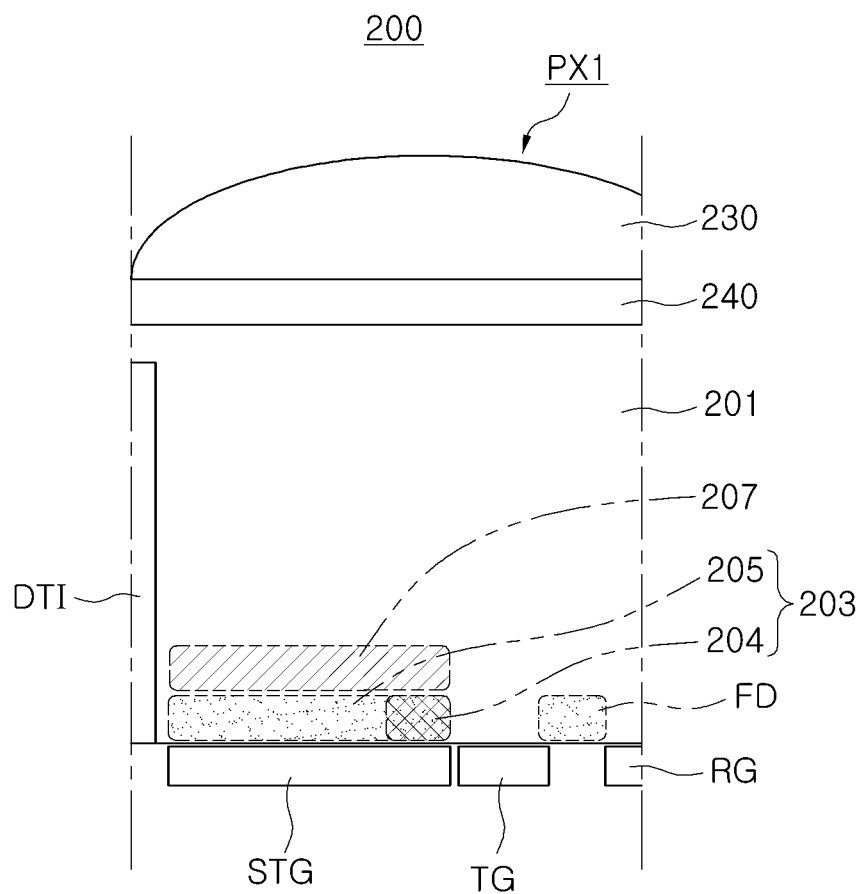

FIGS. 11A and 11B are cross-sectional views illustrating a cross section taken along a direction II-II' of the image sensor 200 illustrated in FIG. 10.

Referring first to FIG. 11A, the first pixel PX1 of the image sensor 200 may include a semiconductor substrate 201, a micro lens 230, an optical insulating layer 240, and the like, and a pixel separation film DTI and an active region 203 may be formed on the semiconductor substrate 201. The active region 203 providing the storage transistor together with the storage gate STG may include a first impurity region 204 and a second impurity region 204 having an impurity concentration lower than that of the first impurity region 204. The first impurity region 204 may be disposed closer to the transfer gate TG than the second impurity region 205.

As an example, when the electrons are the main charge carriers and the transistors included in the pixel circuit are the NMOS transistors, the potential hump section may not appear by the first impurity region 204 having a relatively high impurity concentration. Therefore, when the turn-on voltage is input to the transfer gate TG, the charges stored in the storage transistor may be smoothly transferred to the floating diffusion node FD.

Next, referring to FIG. 11B, the first pixel PX1 of the image sensor 200 may further include a barrier layer 207 provided below the active region 203 of the storage transistor. The barrier layer 207 may be doped with an impurity having conductivity different from that of the main charge carrier of the image sensor 100. As an example, when the transistors included in the pixel circuit of the image sensor 200 are the NMOS transistors, the barrier layer 207 may be doped with a p-type impurity to prevent the charges stored in the storage transistor from leaking.

Figure 12:
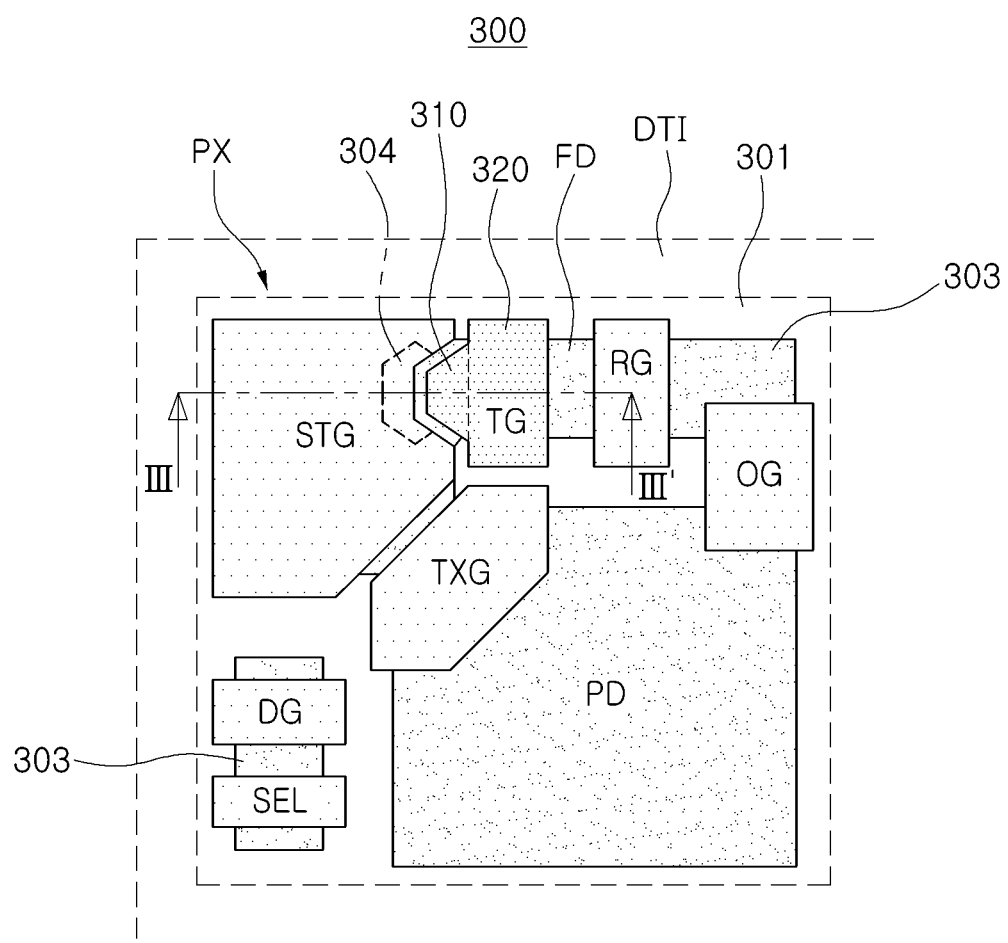
FIG. 12 is a plan view illustrating a pixel included in an image sensor according to an embodiment.

FIG. 12 is a plan view illustrating a pixel included in an image sensor according to an exemplary embodiment. In addition, FIG. 13 is a cross-sectional view illustrating a cross section taken along a direction III-III' of the image sensor illustrated in FIG. 12.

Figure 13:
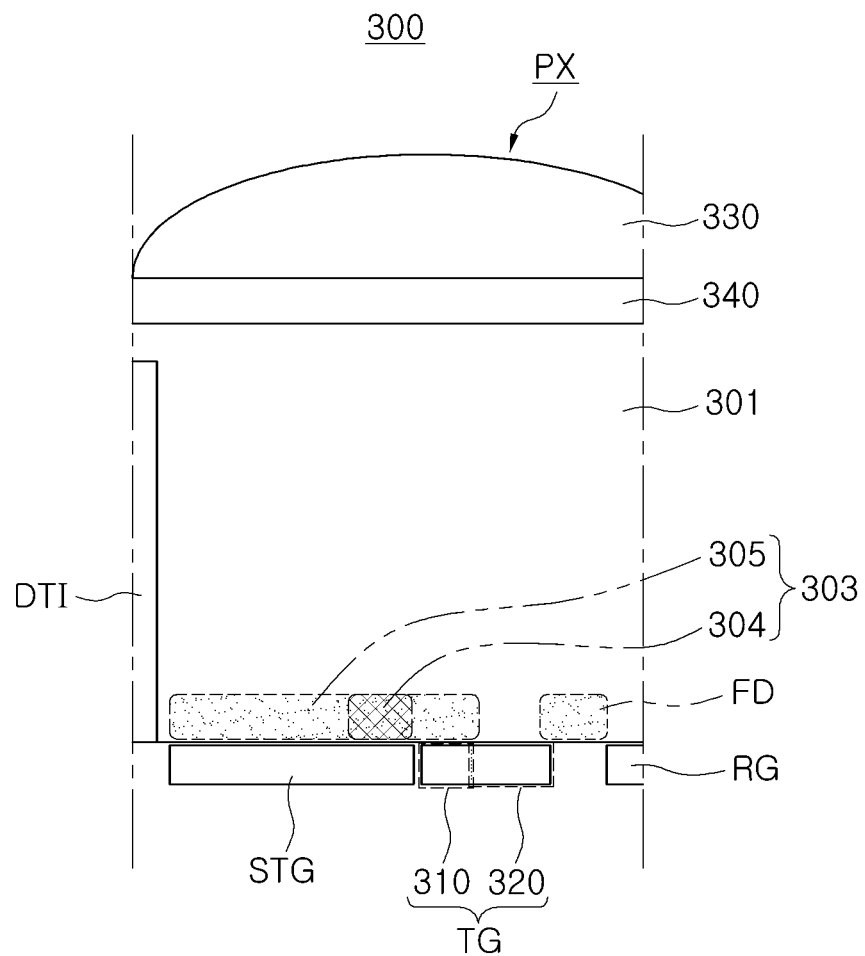
FIG. 13 is a cross-sectional view illustrating a cross section taken along a direction III-III' of the image sensor illustrated in FIG. 12.

Referring to FIGS. 12 and 13, a pixel PX of an image sensor 300 may be optically separated from other pixels by a pixel separation film DTI. The pixel PX may include a semiconductor substrate 301, a micro lens 330, an optical insulating layer 340, and the like, and an active region 303 for providing a plurality of transistors may be formed on the semiconductor substrate 301. A plurality of gates STG, TXG, TG, RG, OG, DG, and SEL may be formed of a conductive material together with the active region 303 to provide a plurality of transistors. The transistors may convert the charges generated by the photodiode PD in response to light into electric signals.

In an exemplary embodiment illustrated in FIGS. 12 and 13, the transfer gate TG may include a first gate region 310 and a second gate region 320. The first gate region 310 may be a region that extends from the second gate region 320 and protrudes toward the storage gate STG, and may have a width narrower than that of the second gate region 320.

In addition, in an exemplary embodiment illustrated in FIGS. 12 and 13, the active region providing the storage transistor may include the first impurity region 304 and a second impurity region 305 defined as the remaining region other than the first impurity region 304. The first impurity region 304 may have an impurity concentration higher than that of the second impurity region 305, and may be adjacent to the transfer gate TG. As an example, the first impurity region 304 may have a shape corresponding to the first gate region 310 as illustrated in FIG. 12, and may surround the first gate region 310 in a plane.

The first impurity region 304 may not overlap the transfer gate TG including the first gate region 310. Therefore, as illustrated in FIG. 13, the first impurity region 304 may be disposed between the second impurity regions 305 in at least one direction.

Figure 14:
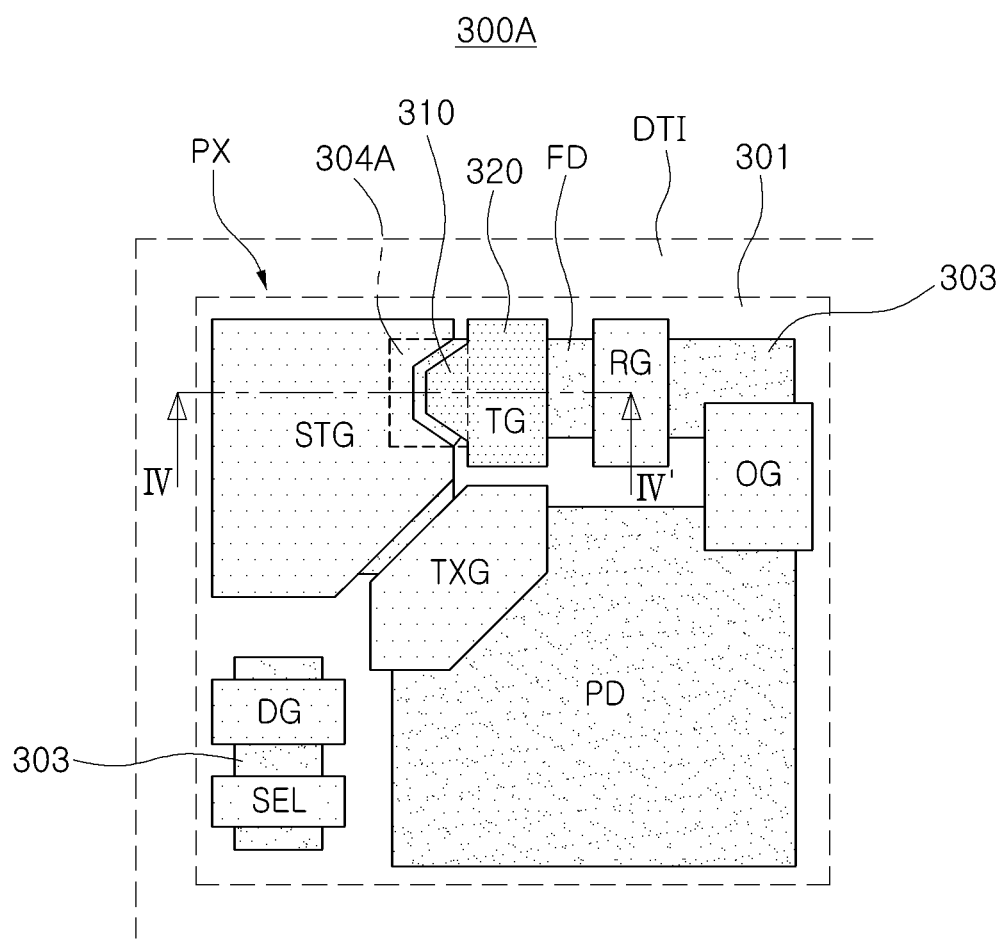
FIG. 14 is a plan view illustrating a pixel included in an image sensor according to an embodiment.
Figure 15:
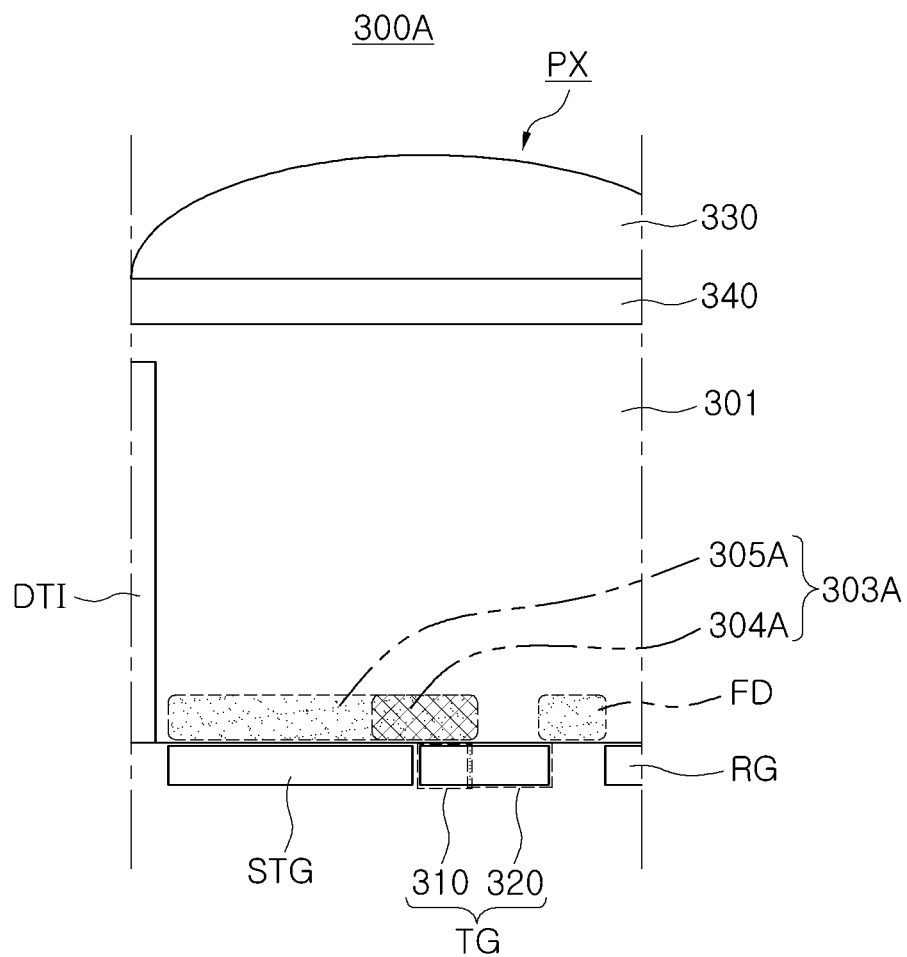
FIG. 15 is a cross-sectional view illustrating a cross section taken along a direction IV-IV' of the image sensor illustrated in FIG. 14.

FIG. 14 is a plan view illustrating a pixel included in an image sensor according to an exemplary embodiment and FIG. 15 is a cross-sectional view illustrating a cross section taken along a direction IV-IV' of the image sensor illustrated in FIG. 14.

Referring to FIGS. 14 and 15, a pixel PX of an image sensor 300A may be surrounded by a pixel separation film DTI and may be optically and electrically separated from other pixels. The pixel PX may include the semiconductor substrate 301 on which the active region 303 is formed, the micro lens 330, the optical insulating layer 340, and the like, and a plurality of transistors implementing a pixel circuit may be provided by a plurality of gates STG, TXG, TG, RG, OG, DG, and SEL formed on the semiconductor substrate 301.

In an exemplary embodiment illustrated in FIGS. 14 and 15, the transfer gate TG may include the first gate region 310 and the second gate region 320. In addition, an active region 303A of the storage transistor may include a first impurity region 304A and a second impurity region 305A. The first gate region 310 may be a region protruding toward the storage transistor and the first impurity region 304A may have an impurity concentration higher than that of the second impurity region 305A.

At least a portion of the first impurity region 304A may be disposed below the transfer gate TG. The first impurity region 304A may not be surrounded by the second impurity region 305A in the active region 303A of the storage transistor. In an exemplary embodiment illustrated in FIGS. 14 and 15, the first impurity region 304A may be disposed closer to the transfer gate TG than the second impurity region 305A.

Figure 16:
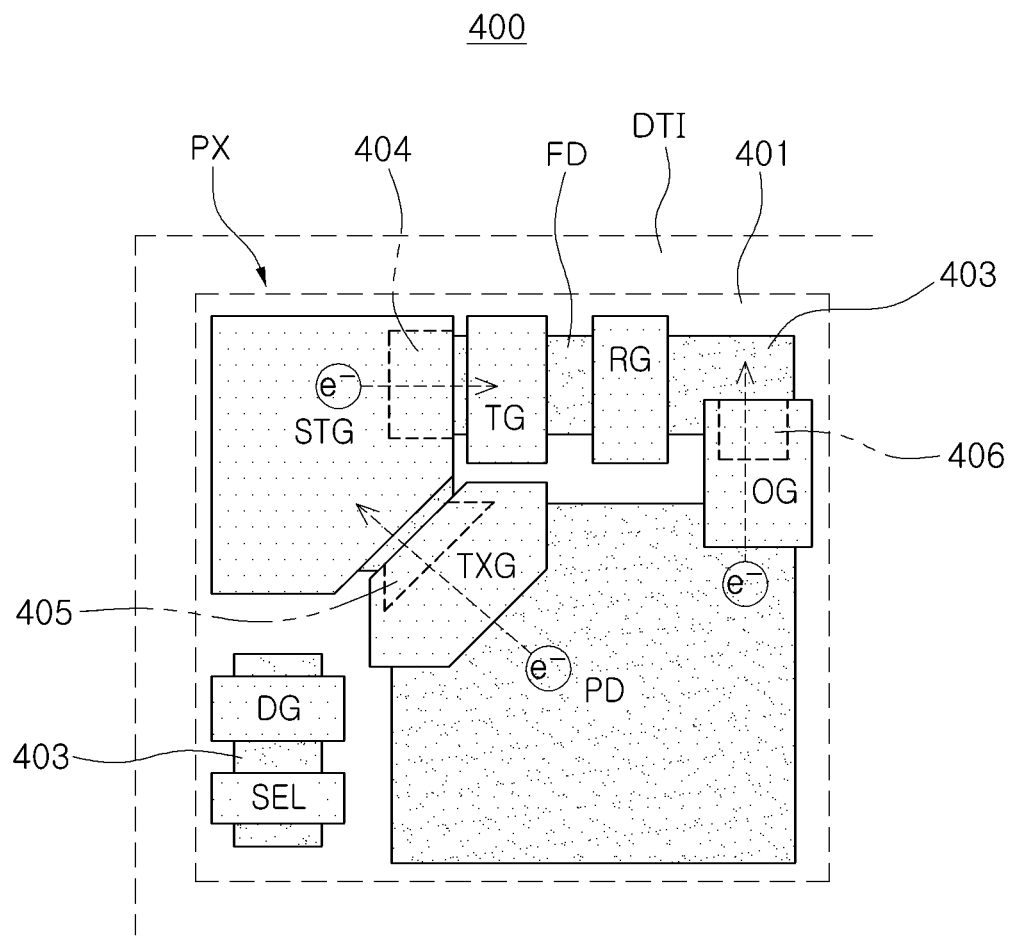
FIGS. 16 and 17 are plan views illustrating pixels included in an image sensor according to an embodiment.
Figure 17:
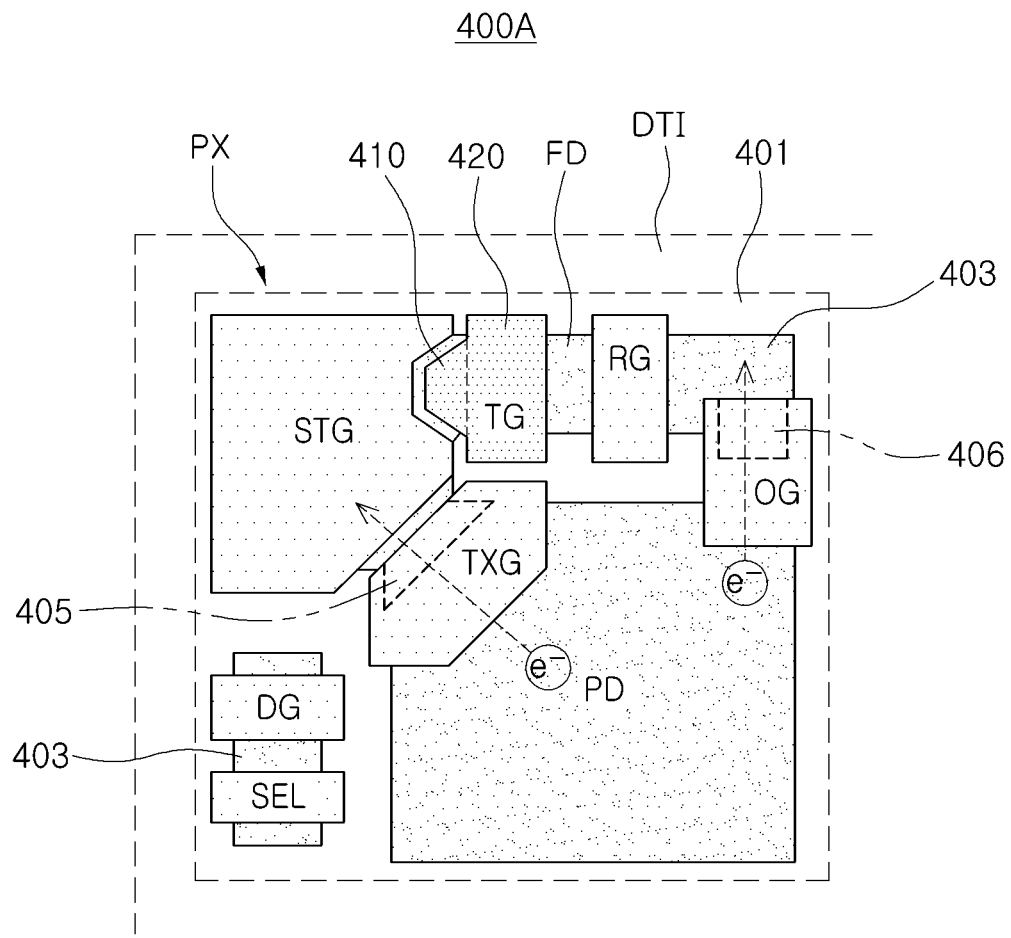

FIGS. 16 and 17 are plan views illustrating pixels included in an image sensor according to an exemplary embodiment.

Referring first to FIG. 16, a pixel PX of an image sensor 400 may be optically and electrically separated from other pixels by a pixel separation film DTI, and may include an active region 403 and a photodiode PD formed on an active region 403 of a semiconductor substrate 401 and a plurality of gates STG, TXG, TG, RG, OG, DG, and SEL disposed on the semiconductor substrate 401. The active region 403 and the gates STG, TXG, TG, RG, OG, DG, and SEL may process charges in the photodiode PD to implement a pixel circuit generating electrical signals.

In an exemplary embodiment illustrated in FIG. 16, regions 404, 405, and 406 having a relatively high impurity concentration may be formed below the storage gate STG, the intermediate transfer gate TXG, and the overflow gate OC, respectively. First, a first impurity region 404 having a relatively high impurity concentration and a second impurity region, which is the remaining active region 403 other than the first impurity region 404, may be disposed below the storage gate STG.

As an example, the active region below the intermediate transfer gate TXG may have a third impurity region 405 having a relatively high impurity concentration and adjacent to the storage gate STG, and a fourth impurity region, which is the remaining active region 403 other than the third impurity region 405. In addition, the active region below the overflow gate OG may have a fifth impurity region 406 having a relatively high impurity concentration and disposed to be away from the photodiode PD, and a sixth impurity region, which is the remaining active region 403 other than the fifth impurity region 406.

The first impurity region 403, the third impurity region 404, and the fifth impurity region 405 may be disposed in consideration of a transfer direction of the charges. As an example, the charges generated by the photodiode PD may pass through the intermediate transfer gate TXG, and may be stored in the storage transistor including the storage gate STG. In addition, when the turn-on voltage is input to the transfer gate TG, the charges may be transferred to the floating diffusion node FD. Therefore, according to the transfer direction of the charges, the third impurity region 405 below the intermediate transfer gate TXG may be adjacent to the storage gate STG, and the first impurity region 404 below the storage gate STG may be adjacent to the transfer gate TG. The charges generated by the photodiode PD may be smoothly transferred to the floating diffusion node FD by the third impurity region 405 below the intermediate transfer gate TXG and the first impurity region 404 below the storage gate STG.

The fifth impurity region 406 formed below the overflow gate OG may prevent a reverse transfer of the charges. When the turn-on voltage is input to the overflow gate OG, the charges of the photodiode PD may be removed by a power supply voltage. In an exemplary embodiment illustrated in FIG. 16, the fifth impurity region 406 below the overflow gate OG may significantly reduce the reverse transfer that the charges transfers back to the photodiode PD while the turn-on voltage is input to the overflow gate OG, and quickly remove the charges of the photodiode PD, thereby preventing a saturation of the photodiode PD.

Next, referring to FIG. 17, in a pixel PX of an image sensor 400A, the transfer gate TG may include a first gate region 410 and a second gate region 420. The first gate region 410 may be a region that extends from the second gate region 420 and protrudes toward the storage gate STG, and may be accommodated in a space provided in the storage gate STG. In an exemplary embodiment illustrated in FIG. 17, the first gate region 410 may be formed to prevent an occurrence of potential hump between the storage transistor and the transfer transistor.

Referring to FIG. 17, the pixel PX of the image sensor 400A may have the third impurity region 405 and the fifth impurity region 406 having the relatively high impurity concentration and formed on the active regions of the intermediate transfer transistor and the overflow transistor, respectively. In addition, unlike the exemplary embodiment illustrated in FIG. 16, the first impurity region 404 may not be formed on the active region of the storage transistor. However, according to exemplary embodiments, as described above with reference to FIGS. 12 and 14, the first impurity region 404 may also be added to the active region of the storage transistor.

Figure 18:
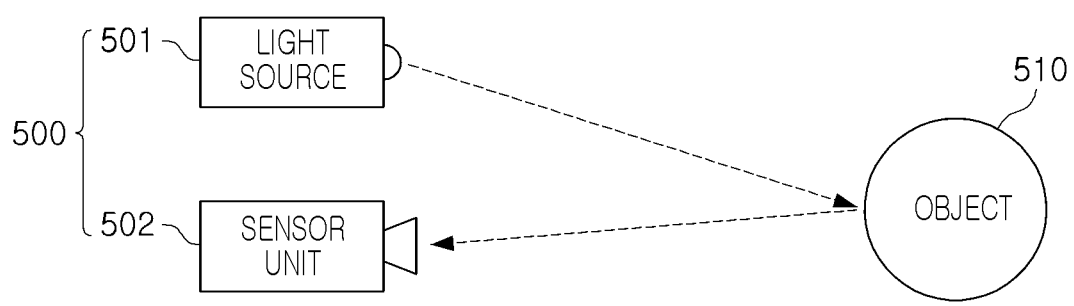
FIG. 18 is a diagram illustrating the imaging device including an image sensor according to an embodiment.

FIG. 18 is a diagram illustrating an imaging device including an image sensor according to an exemplary embodiment.

Referring to FIG. 18, an imaging device 500 according to an exemplary embodiment may include a light source 501 and a sensor unit 502. The light source 501 may include a light emitting element outputting an optical signal having a specific wavelength band. As an example, the light source 501 may include vertical cavity surface emitting laser (VCSEL), a light emitting diode (LED), or the like as the light emitting element. The light source 501 may include a plurality of light emitting elements arranged in the form of an array, and optical elements may be further provided on process paths of optical signals output by the light emitting elements. The optical signals output by the light source 501 may be optical signals having an infrared wavelength band.

The optical signals output by the light source 501 may be reflected by an object 510, and the sensor unit 502 may be input with the optical signals reflected by the object 510 as received optical signals. The sensor unit 502 may include a pixel array having pixels generating electrical signals in response to the received optical signals, a controller generating an image using the electrical signals generated by the pixel array, and the like. As an example, the image generated by the controller may be a depth map including the object 510 and distance information of environments around the object 510.

In an exemplary embodiment, the sensor unit 502 may provide a proximity sensing function for sensing the presence of the object 510 close to the imaging device 500, a distance measuring function for calculating a distance between the object 510 and the imaging device 500, and the like, together with a function for generating the depth map. As the sensor unit 502 accurately detects the received optical signals which are output by the light source 501 and are reflected by the object 510, the above-mentioned functions may be implemented more accurately. Therefore, in order to increase sensitivity of the sensor unit 502, an area of the photodiode included in each of the pixels may be increased.

Figure 19:
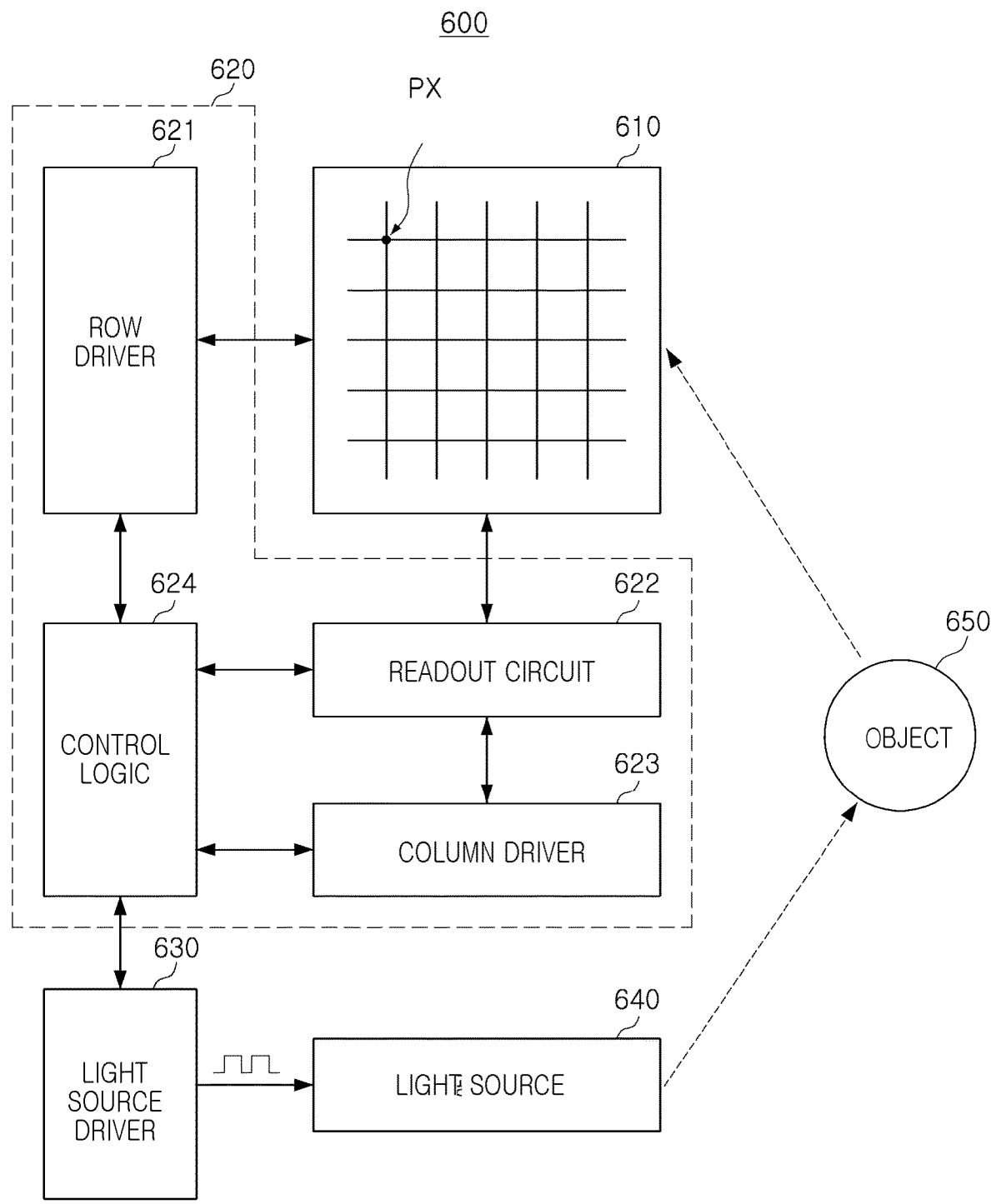
FIG. 19 is a block diagram illustrating an imaging device including an image sensor according to an embodiment.

FIG. 19 is a block diagram illustrating the imaging device including an image sensor according to an exemplary embodiment.

Referring to FIG. 19, an imaging device 600 may include a pixel array 610, a controller 620, a light source driver 630, a light source 640, and the like.

The pixel array 610 may include a plurality of pixels PXs arranged in the form of array along a plurality of rows and a plurality of columns. Each of the pixels PX may include a photodiode generating charges in response to optical signals incident from an object 650, and a pixel circuit generating an electrical signal corresponding to the charges generated by the photodiode. As an example, the pixel circuit may include a floating diffusion node, an intermediate transfer transistor, a storage transistor, a transfer transistor, a reset transistor, a driving transistor, a selection transistor, and the like. The configuration of the pixels PXs may vary depending on the exemplary embodiments. As an example, each of the pixels PXs may include an organic photodiode that includes an organic material, unlike a silicon photodiode, or may be implemented as a digital pixel. When the pixel PX is implemented as the digital pixel, each of the pixels PXs may include a comparator, a counter converting an output of the comparator into a digital signal and outputs the digital signal, and the like.

The controller 620 may include a plurality of circuits for controlling the pixel array 610. As an example, the controller 620 may include a row driver 621, a readout circuit 622, a column driver 623, a control logic 624, and the like. The row driver 621 may drive the pixel array 610 in units of rows. For example, the row driver 621 may generate a transfer control signal that controls the transfer transistor of the pixel circuit, a reset control signal that controls the reset transistor, a selection control signal that controls the selection transistor, and the like.

The readout circuit 622 may include a correlated doubled sampler (CDS), an analog-to-digital converter (ADC), and the like. The correlated double sampler may be connected to the pixels PXs included in a row selected by a row selection signal supplied by the row driver 621 through column lines, and may perform correlated double sampling to detect the reset voltage and the pixel voltage. The analog-to-digital converter may convert the reset voltage and the pixel voltage detected by the correlated double sampler into digital signals, and may transfer the digital signals to the column driver 623.

The column driver 623 may include a latch or buffer circuit in which the digital signals may be temporarily stored, an amplification circuit, and the like, and process the digital signals received from the readout circuit 622. The row driver 621, the readout circuit 622, and the column driver 623 may be controlled by the control logic 624. The control logic 624 may include a timing controller for controlling operation timings of the row driver 621, the readout circuit 622, and the column driver 623, an image signal processor for processing image data, and the like.

The control logic 624 may perform signal processing for data output by the readout circuit 622 and the column driver 623 to generate image data. As an example, the image data may include a depth map. In addition, the control logic 624 may calculate a distance between the object 650 and the imaging device 600 or recognize the object 650 close to the imaging device 600 by using the data output by the readout circuit 622 and the column driver 623 according to an operation mode of the imaging device 600.

The imaging device 600 may include the light source 640 outputting the optical signal to the object 650 to generate the depth map. The light source 640 may include one or more light emitting elements, and as an example, a plurality of semiconductor light emitting elements may include semiconductor chips arranged in the form of an array. The light source 640 may operate by the light source driver 630. The light source driver 630 may be controlled by the controller 620.

In an exemplary embodiment, the light source driver 630 may generate a predetermined pulse signal to drive the light source 640. The light source driver 630 may respond to a control command of the controller 620 to determine a period, a duty ratio, duration, and the like of the pulse signal. As an example, the controller 620 may synchronize at least one of the signals input to the pixel array 610 with the pulse signal input to the light source 640. In an exemplary embodiment, the signal synchronized with the pulse signal input to the light source 640 may be at least one of the signals input to the pixel array 610 by the row driver 621.

Figure 20:
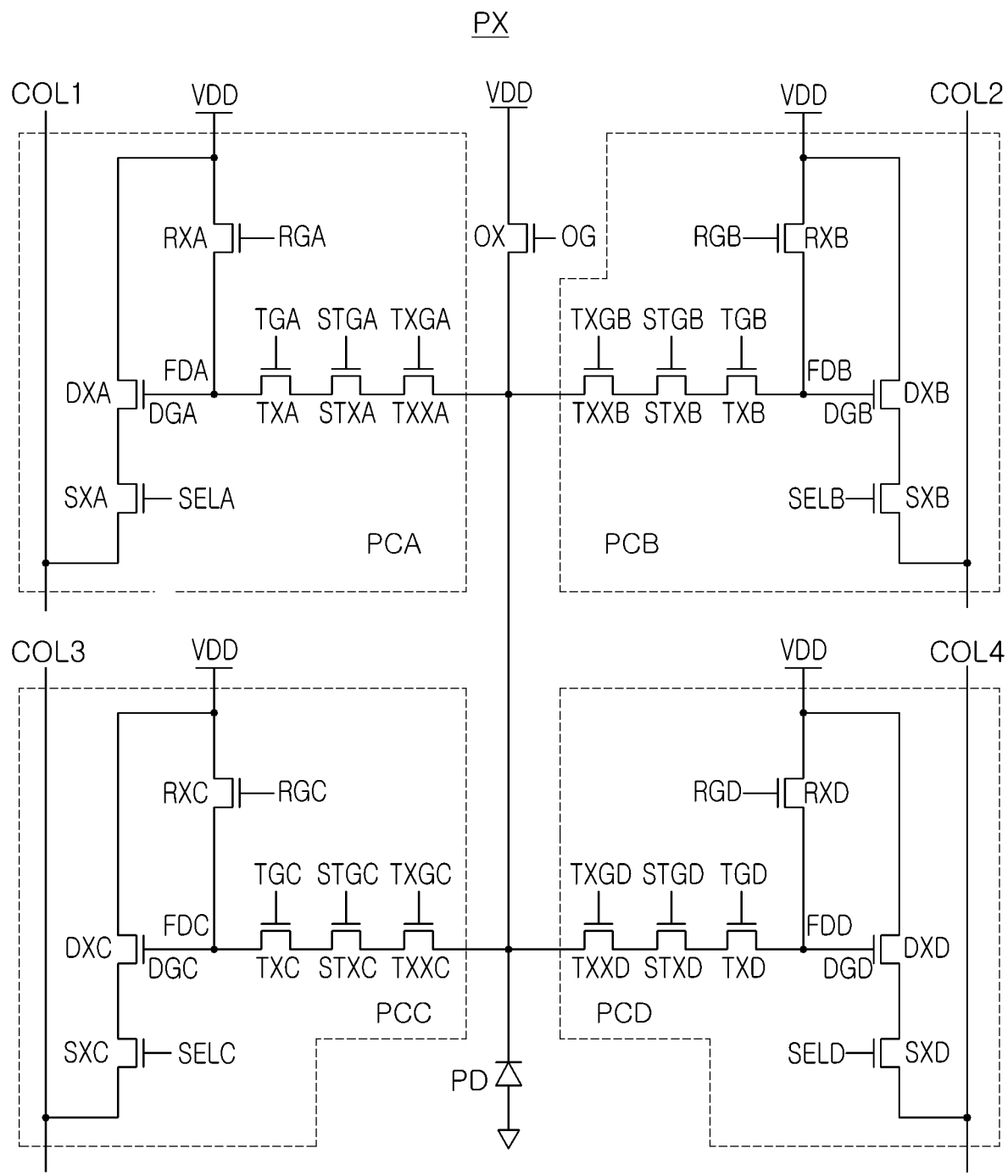
FIG. 20 is a circuit diagram illustrating pixel circuits of a pixel included in an image sensor according to an embodiment.

FIG. 20 is a circuit diagram illustrating pixel circuits of a pixel included in an image sensor according to an exemplary embodiment.

Referring to FIG. 20, in a pixel PX of an image sensor according to an exemplary embodiment, a plurality pixel circuit circuits PCA, PCB, PCC, and PCD may be connected to a single photodiode PD. Although it is illustrated in an exemplary embodiment illustrated in FIG. 20 that first to fourth pixel circuits PCA, PCB, PCC, and PCD are connected to the photodiode PD, the number of pixel circuits may be changed according to the exemplary embodiments. The first to fourth pixel circuits PCA, PCB, PCC, and PCD may have substantially the same structure as each other.

The image sensor according to an exemplary embodiment illustrated in FIG. 20 may be a time-of-flight (ToF) sensor that detects optical signals discharged from a separate light source and reflected from the object to determine a shape of the object, a distance to the object, and the like. The optical signals discharged from the light source may be reflected from the object to generate a phase difference, and the image sensor may determine the shape of the object, the distance to the object, and the like by using the phase difference. As an example, the image sensor may generate a depth map including the shape of the object, the distance to the object, or the like by using information obtained from the separate pixel PX.

The image sensor applied as the ToF sensor may operate in a global shutter manner. While the photodiode is exposed to light, first to fourth intermediate transfer transistors TXXA, TXXB, TXXC, and TXXD included in the first to fourth pixel circuits PCA, PCB, PCC, and PCD may operate with phases different from one another. As an example, the first intermediate transfer transistor TXXA may be turned on and off with the same phase as the optical signal, and the second intermediate transfer transistor TXXB may be turned on and off with a phase difference of 180 degrees with the optical signal. The third intermediate transfer transistor TXXC may be turned on and off with a phase difference of 90 degrees with the optical signal, and the fourth intermediate transfer transistor TXXD may be turned on and off with a phase difference of 270 degrees with the optical signal.

The image sensor may generate the depth map by using pixel voltages obtained from the charges stored in first to fourth storage transistors STXA, STXB, STXC, and STXD by the phase difference operations as described above. In a readout operation, first data corresponding to the charges stored in the first storage transistor STXA may be output through a first column line COL1, and third data corresponding to the charges in the third storage transistor STXC may be output through a third column line COL3. In addition, second data corresponding to the charges stored in the second storage transistor STXB may be output through a second column line COL2, and fourth data corresponding to the charges in the fourth storage transistor STXD may be output through a fourth column line COLO. Meanwhile, according to the exemplary embodiments, the first pixel circuit PCA and the third pixel circuit PCC may be connected to a single column line, and the second pixel circuit PCB and the fourth pixel circuit PCD may also be connected to a single column line.

Figure 21:
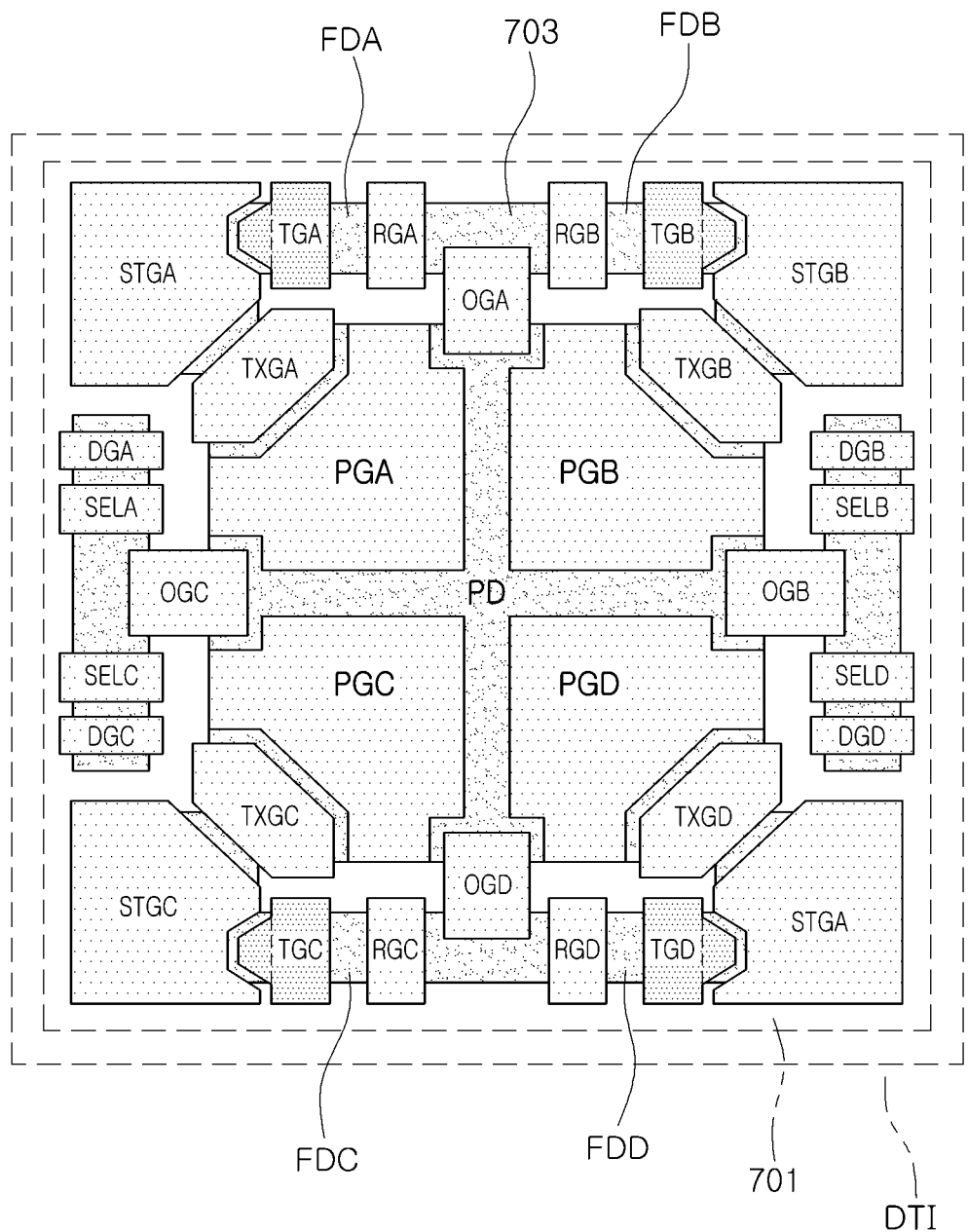
FIGS. 21 through 23 are plan views illustrating pixels included in an image sensor according to an embodiment.
Figure 22:
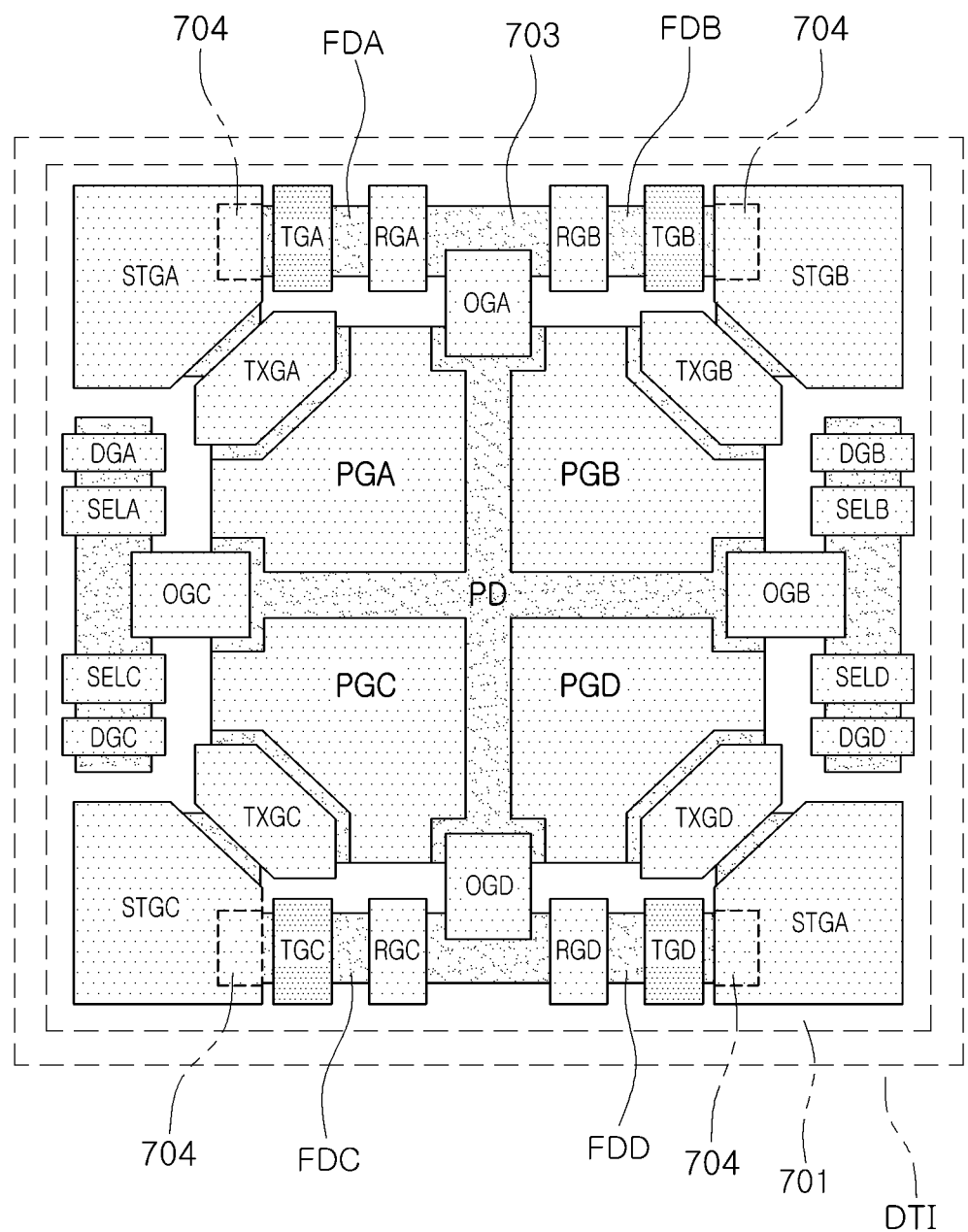
Figure 23:
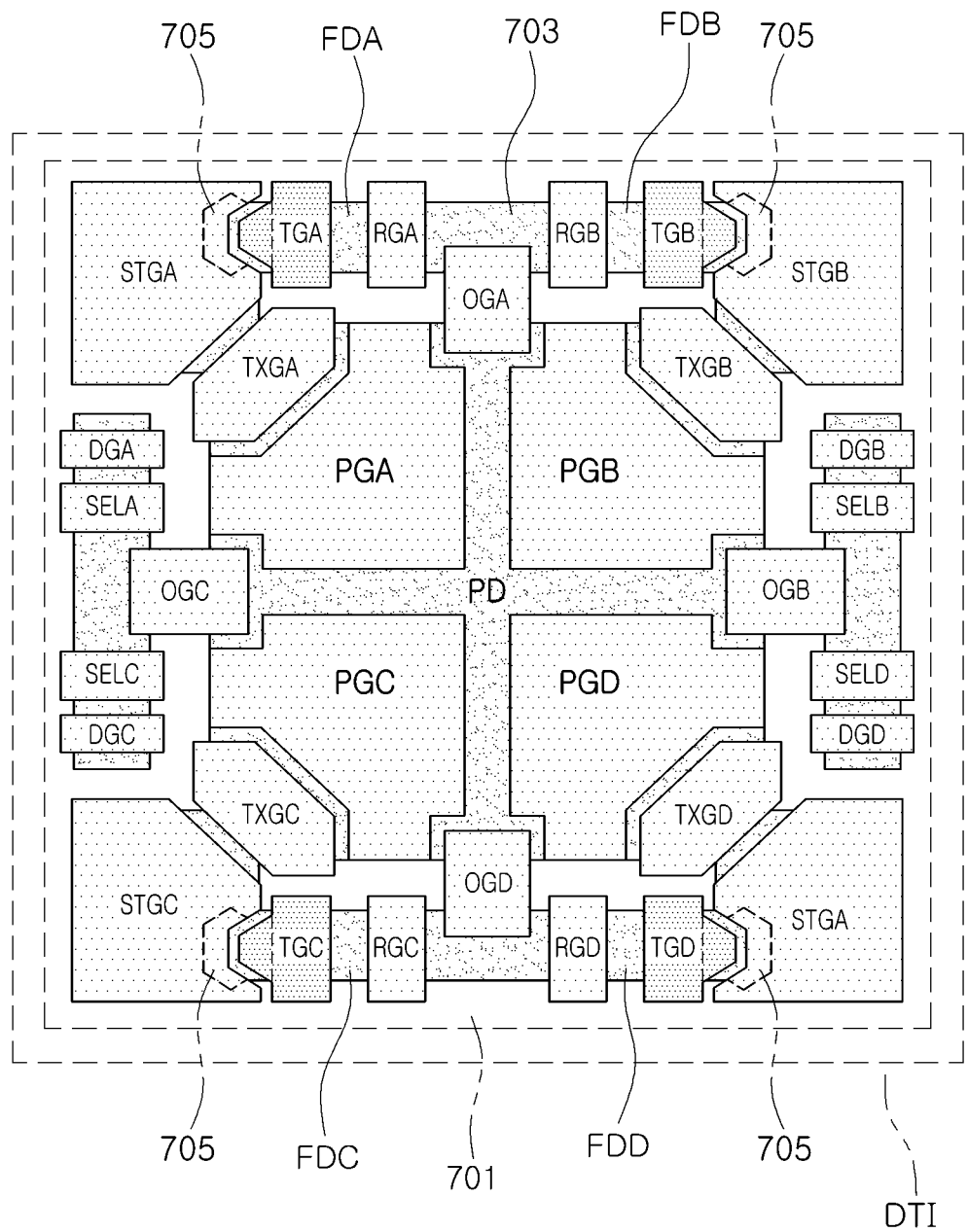

FIGS. 21 through 23 are plan views illustrating pixels included in an image sensor according to an exemplary embodiment.

As an example, a pixel 700 illustrated in FIGS. 21 through 23 may correspond to the pixel PX described above with reference to FIG. 20. Referring first to FIG. 21, a pixel 700 may be optically and electrically separated from other pixels PXs by a pixel separation film DTI formed on a semiconductor substrate 701. In addition, the pixel 700 may include a photodiode PD, and first to fourth photo gates PGA, PGB, PGC, and PGD may be disposed on the photodiode PD. An active region 703 for providing a plurality of transistors may be formed on the semiconductor substrate 701.

The first to fourth photo gates PGA, PGB, PGC, and PGD may be provide for connecting the photodiode PD with first to fourth pixel circuits. As an example, the charges generated by the photodiode PD may be stored in a first storage transistor while the turn-on voltage is input to a first intermediate transfer gate TXGA and a first storage gate STGA. While the turn-on voltage is input to the first intermediate transfer gate TXGA and the first storage gate STGA, the turn-off voltage may be input to second to fourth intermediate transfer gates TXGB, TXGC, and TXGD and second to fourth storage gates STGB, STGC, and STGD.

In an exemplary embodiment illustrated in FIG. 21, a first transfer gate TGA may have a protrusion region extending toward the first storage gate STGA. The first storage gate STGA may provide a space for accommodating the protrusion region of the first transfer gate TGA. Second to fourth transfer gates TGB, TGC, and TGD and the second to fourth storage gates STGB, STGC, and STGD may have a shape similar to that of the first transfer gate TGA and the first storage gate STGA, respectively.

Similarly to the exemplary embodiments described above, the protrusion region overlapping at least a portion of the active region 703 of the first storage transistor may be formed in the first transfer gate TGA to prevent an occurrence of potential hump when the turn-on voltage is input to the first transfer gate TGA. Therefore, when the turn-on voltage is input to the first transfer gate TGA, the charges generated by the photodiode PD and stored in the first storage transistor may be smoothly transferred to the floating diffusion node FD.

Next, structures and operations of pixels 700A and 700B included in the image sensor according to an exemplary embodiment will be described with reference to FIGS. 22 and 23. For convenience of explanation, the description overlapping that of the pixel 700 according to an exemplary embodiment illustrated in FIG. 21 will be omitted.

Referring first to FIG. 22, first to fourth transfer gates TGA, TGB, TGC, and TGD included in a pixel 700A may not include protrusion regions. A first pixel circuit will be described as an example. A first impurity region 704 having a relatively high impurity concentration may be formed in a portion of an active region of a first storage transistor adjacent to the first transfer gate TGA. By forming the first impurity region 704, a potential hump may be prevented at a boundary between the first storage transistor and the first transfer transistor and transfer efficiency of the charges may be improved. The first impurity region 704 may also be formed on the active regions of the second to fourth storage transistors.

Next, referring first to FIG. 23, first to fourth transfer gates TGA, TGB, TGC, and TGD included in a pixel 700B may include protrusion regions. In addition, portions of the active regions of the first to fourth storage transistors may be additionally doped with an impurity to form first impurity regions 705. The first impurity regions 705 may be formed to be adjacent to the protrusion regions of the first to fourth transfer gates TGA, TGB, TGC, and TGD in consideration of a transfer direction of the charges. Therefore, when the turn-on voltage is input to each of the first to fourth transfer gates TGA, TGB, TGC, and TGD, an occurrence of a potential hump may be prevented and transfer efficiency of the charges may be increased.

Figure 24:
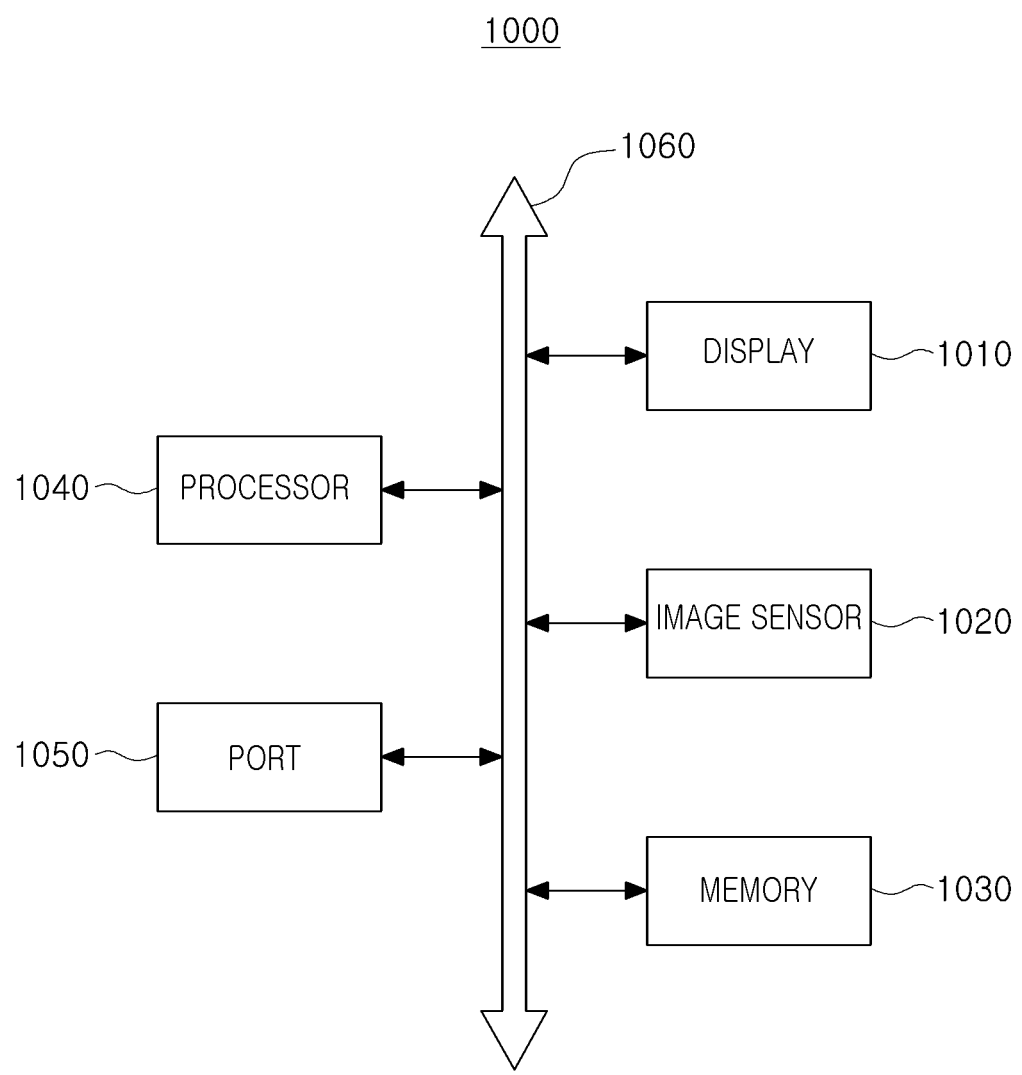
FIG. 24 is a block diagram illustrating an electronic device including an image sensor according to an embodiment.

FIG. 24 is a block diagram illustrating an electronic device including an image sensor according to an exemplary embodiment.

A computer device 1000 according to an exemplary embodiment illustrated in FIG. 24 may include a display 1010, an image sensor 1020, a processor 1040, a port 1050, and the like. In addition, the computer device 1000 may further include a wired and wireless communication device, a power supply device, and the like. Among the components illustrated in FIG. 24, the port 1050 may be a device through which the computer device 1000 communicates with a video card, a sound card, a memory card, a USB device, or the like. The computer device 1000 may be a concept including both a general desktop computer or a laptop computer, as well as a smartphone, a tablet PC, and a smart wearable device.

The processor 1040 may perform specific operations, instructions, tasks, or the like. The processor 1040 may be a central processing unit (CPU), a microprocessor unit (MCU), a system on chip (SoC), or the like, and may communicate with other devices connected to the port 1050 as well as the display 1010, the sensor unit 1020, the memory device 1030 via a bus 1060.

The memory 1030 may be a storage medium for storing data necessary for the operation of the computer device 1000, or multimedia data. The memory 1030 may include a volatile memory, such as a random access memory (RAM), or a non-volatile memory such as a flash memory. In addition, the memory 1030 may include at least one of a solid state drive (SSD), a hard disk drive (HDD), and an optical drive (ODD) as a storage device. The image sensor 1020 may be employed in the computer device 1000 in the forms according to various exemplary embodiments described with reference to FIGS. 1 through 23.

As set forth above, according to the exemplary embodiment, at least a portion of the gate of the transfer transistor may protrude toward the gate of the storage transistor, or some regions adjacent to the transfer transistor in the active region of the storage transistor may have a relatively high impurity concentration relative to other regions. Therefore, when the transfer transistor is turned on, the potential between the storage transistor and the transfer transistor may gradually decrease as it is closer to the transfer transistor, and the charge transfer efficiency may be increased to improve the performance of the image sensor.

Various advantages and effects of the inventive concept are not limited to the description above, and may be more readily understood in the description of exemplary embodiments.

While exemplary embodiments have been shown and described above, it will be apparent to those skilled in the art that modifications and variations could be made without departing from the scope of the present invention as defined by the appended claims.

What is claimed is:

1. An image sensor comprising a plurality of pixels, at least one of the pixels comprising:
 a photodiode configured to generate charges in response to light; and
 a pixel circuit comprising a storage transistor configured to store the charges generated by the photodiode, and a transfer transistor connected between the storage transistor and a floating diffusion node,
 wherein a potential of a boundary region between the storage transistor and the transfer transistor has a first potential when the transfer transistor is in a turned-off state, and has a second potential, lower than the first potential, when the transfer transistor is in a turned-on state.

2. The image sensor of claim 1, wherein a gate of the transfer transistor comprises a first gate region protruding toward the storage transistor and a second gate region connected to the first gate region, and
 wherein the first gate region is disposed on the boundary region.

3. The image sensor of claim 2, wherein the first gate region of the transfer transistor is disposed on at least a portion of an active region of the storage transistor.

4. The image sensor of claim 2, wherein a width of the first gate region is smaller than a width of the second gate region in the transfer transistor.

5. The image sensor of claim 2, wherein a gate of the storage transistor provides a space receiving the first gate region of the transfer transistor.

6. The image sensor of claim 5, wherein an active region of the storage transistor comprises:
 a first impurity region adjacent to the first gate region, and
 a second impurity region having an impurity concentration lower than an impurity concentration of the first impurity region.

7. The image sensor of claim 6, wherein the first impurity region is surrounded by the second impurity region in the storage transistor.

8. The image sensor of claim 6, wherein at least a portion of the first impurity region of the storage transistor is disposed below the first gate region of the transfer transistor.

9. The image sensor of claim 1, wherein an active region of the storage transistor comprises:
 a first impurity region adjacent to a gate of the transfer transistor, and
 a second impurity region having an impurity concentration lower than an impurity concentration of the first impurity region, and
 the first impurity region is disposed on the boundary region.

10. The image sensor of claim 9, wherein an area of the first impurity region is smaller than an area of the second impurity region in the storage transistor.

11. The image sensor of claim 9, wherein the pixel circuit further comprises an intermediate transfer transistor connected between the photodiode and the storage transistor, and
 wherein an active region of the intermediate transfer transistor comprises a third impurity region adjacent to the storage transistor, and a fourth impurity region having an impurity concentration lower than an impurity concentration of the third impurity region.

12. The image sensor of claim 9, wherein the pixel circuit further comprises an overflow transistor connected between the photodiode and a first power supply node, and
 wherein an active region of the overflow transistor comprises a fifth impurity region adjacent to the first power supply node, and a sixth impurity region having an impurity concentration lower than an impurity concentration of the fifth impurity region.

13. The image sensor of claim 1, wherein each of the pixels comprises the pixel circuit comprising the storage transistor and the transfer transistor, and
 wherein the pixels share the photodiode.

14. The image sensor of claim 13, wherein at least one of the pixels comprises a transfer gate comprising a first gate region protruding toward the storage transistor and a second gate region connected to the first gate region.

15. The image sensor of claim 13, wherein at least one of the pixels comprises a first impurity region adjacent to the transfer transistor and a second impurity region having an impurity concentration lower than an impurity concentration of the first impurity region.

16. The image sensor of claim 1, further comprising:
a barrier layer disposed below an active region of the storage transistor.

17. An image sensor comprising a plurality of pixels, at least one of the pixels comprising:
a photodiode configured to generate charges in response to light; and
a pixel circuit comprising a storage transistor connected to the photodiode and a transfer transistor connected between the storage transistor and a floating diffusion node,
wherein, in the pixel circuit, a potential is gradually decreased between the transfer transistor and the storage transistor in a direction away from the storage transistor when the transfer transistor is turned on.

18. The image sensor of claim 17, wherein a gate of the storage transistor comprises a concave portion, and wherein a gate of the transfer transistor comprises a convex portion corresponding to the concave portion.

19. The image sensor of claim 18, wherein when the transfer transistor is turned on, the potential is gradually decreased below the concave portion and the convex portion in the direction away from the storage transistor.

20. An image sensor comprising a plurality of pixels, at least one of the pixels comprising:
a photodiode configured to generate charges in response to light; and
a pixel circuit comprising a storage transistor configured to store the charges generated by the photodiode, and a transfer transistor connected between the storage transistor and a floating diffusion node,
wherein an active region of the storage transistor comprises a first impurity region and a second impurity region having an impurity concentration lower than an impurity concentration of the first impurity region, and
wherein the second impurity region and the first impurity region are sequentially disposed according to a transfer direction of the charges, the first impurity region being disposed closer to the transfer transistor.

\* \* \* \* \*